(12) United States Patent
Marceau et al.

(10) Patent No.: US 10,430,526 B2
(45) Date of Patent: Oct. 1, 2019

(54) SYSTEMS AND METHODS FOR DISPLAYING IMPACT ANALYSIS DATA WHILE DESIGNING AN ARCHITECTURAL STRUCTURE

(71) Applicant: Sefaira, Inc., New York, NY (US)

(72) Inventors: Guillaume Marceau, Brooklyn, NY (US); David Wightman Swartz, Brooklyn, NY (US); Ritwik Raj, New York, NY (US); Jacob Miles, New York, NY (US); Carl Styan Sterner, New York, NY (US); Jeremy Gayed, Washingon Township, NJ (US); Varun Singh, New York, NY (US); Mads Naestholt Jensen, London (GB); Alex Jones Tollefsen, Brooklyn, NY (US); Katrina Leigh Schoen, Astoria, NY (US)

(73) Assignee: Safaira, Inc., New York, NY (US)

( * ) Notice: Subject to any disclaimer, the term of this patent is extended or adjusted under 35 U.S.C. 154(b) by 831 days.

(21) Appl. No.: 14/327,908

(22) Filed: Jul. 10, 2014

(65) Prior Publication Data
US 2015/0234944 A1   Aug. 20, 2015

Related U.S. Application Data

(60) Provisional application No. 61/941,329, filed on Feb. 18, 2014.

(51) Int. Cl.
  *G06F 17/50*   (2006.01)
  *H04L 29/08*   (2006.01)

(52) U.S. Cl.
  CPC ...... *G06F 17/5004* (2013.01); *G06F 17/5018* (2013.01); *H04L 67/12* (2013.01)

(58) Field of Classification Search
  CPC .......... G96F 9/54; G06F 17/5018; G06F 9/54
  (Continued)

(56) References Cited

U.S. PATENT DOCUMENTS

| | | | |
|---|---|---|---|
| 8,866,343 B2* | 10/2014 | Abraham | E06B 9/68 307/85 |
| 9,625,893 B2* | 4/2017 | Cho | G05B 19/02 |

(Continued)

OTHER PUBLICATIONS

Haider Taha, Modeling the Impacts of Large-Scale Albedo Changes on Ozone Air Quality in the South Coast Air Basin. (Year: 2000).*

(Continued)

*Primary Examiner* — Lechi Truong
(74) *Attorney, Agent, or Firm* — Kilpatrick Townsend & Stockton LLP

(57) ABSTRACT

Various embodiments provide systems and methods enabling a user to receive feedback regarding a computer-implemented design of an architectural structure as the user is designing or otherwise modifying the computer-implemented design using a computer-aided design (CAD) software tool. The feedback (hereafter also referred to as "design feedback") may provide the user with useful analysis information regarding the architectural structure's predicted characteristics (e.g., operational performance, resource consumption, cost, etc.) based on the current state of the computer-implemented design. In particular, heating and cooling loads associated with the computer-implemented design of the architectural structure can be visually displayed to the user in real or near-real-time along with the relationships to contributing factors that impact the heating and cooling loads.

20 Claims, 19 Drawing Sheets

(58) Field of Classification Search
USPC .............................................. 719/310; 703/5
See application file for complete search history.

(56) References Cited

U.S. PATENT DOCUMENTS

| | | | |
|---|---|---|---|
| 2007/0045444 A1* | 3/2007 | Gray | F23N 5/022 236/94 |
| 2007/0219093 A1* | 9/2007 | Shimbo | B41M 5/305 503/201 |
| 2010/0070093 A1* | 3/2010 | Harrod | G05B 19/042 700/278 |
| 2012/0173209 A1 | 7/2012 | Krebs et al. | |
| 2013/0158720 A1* | 6/2013 | Zywicki | G05D 23/1934 700/276 |
| 2014/0319231 A1* | 10/2014 | Matsuoka | G05D 22/02 236/51 |

OTHER PUBLICATIONS

International Search Report and the Written Opinion for International App No. PCT/US2015/015159, dated May 19, 2015, United States Patent and Trademark Office.
Andersson. Incorporation of Energy Performance Data in the Design Process: Heating and Cooling Load Estimation and Analysis in a Computerized Space Allocation Procedure. MIT Thesis, Jun. 1977 (pp. 1-111), Massachusetts, U.S.
Bhatia. HVAC Made Easy: A Guide to Heating & Cooling Load Estimation. PDH Center, 2012 (pp. 1-79), Virginia, U.S.

* cited by examiner

SYSTEMS AND METHODS FOR DISPLAYING IMPACT ANALYSIS DATA WHILE DESIGNING AN ARCHITECTURAL STRUCTURE

RELATED APPLICATIONS

The present application claims the benefit of U.S. Provisional Patent Application No. 61/941,329, entitled "Systems and Methods for Displaying Impact Analysis Data While Designing an Architectural Structure," filed on Feb. 18, 2014, which is hereby incorporated by reference in its entirety.

TECHNICAL FIELD

The disclosed technology relates generally to structure analysis, and more particularly, some embodiments relate to impact analysis feedback of a simulated computer model of a three-dimensional architectural structure, in real-time or near real-time.

DESCRIPTION OF THE RELATED ART

During the design phase of an architectural structure, architects consider and analyze, among other things, where and how energy, water, materials, and other resources associated with the architectural structure (e.g., building, bridges, etc.) are being consumed or utilized. Generally, architects attempt to optimize their design of architectural structures for optimal resource consumption (e.g., energy, water, materials, etc.), lower construction costs, lower operational costs, and lower maintenance costs. In addition to lowering overall costs and resource uses, an optimized design may also improve a structure's compliance with building or architectural standards, certifications and ratings. Standards, certifications and ratings include green building certification and rating systems, such as Leadership in Energy & Environmental Design (LEED®) and Code for Sustainable Homes (CSH), and environmental impact rating systems, such as Building Research Establishment Environment Assessment Method (BREEAM).

Optimizing the design of an architectural structure can often involve adding, removing, or otherwise modifying structural features of the architectural structure, floors, walls, roofs, or a fenestration (e.g., window or doorway). For example, an architect may use architectural-structure modeling software (e.g., computer-aided design [CAD] software) to modify the geometry, position, or type of a structural feature represented in an architectural structure design. Such modifications can influence the resource consumption, construction cost, operation cost, or maintenance cost of the architectural structure that constructed from the design.

Unfortunately, architects seeking to achieve sustainable architectural designs are finding themselves expending more and more time optimizing the design to achieve their particular sustainability goals. The expended time not only influences the development schedule for an architectural structure, but also proves to be disadvantageous when design documents need to be submitted in a timely fashion as proof of building standards compliance (e.g., green standards).

Additionally, architects are not able to readily appreciate the impact of their designs on energy performance of their architectural designs. That is, architects relying on conventional design tools are unable to easily understand how a particular building design operates in response to their design choices. Moreover, it is inconvenient for architects to optimize performance of the building design without a real or near real-time visualization of the impact of their designs on energy performance.

BRIEF SUMMARY OF EMBODIMENTS

Various embodiments provide systems and methods enable a user to receive feedback regarding a computer-implemented design model, representing an architectural structure (e.g., office buildings, bridges, parking structures, shopping centers, etc.), as the user is designing or otherwise modifying the computer-implemented design using a computer-aided design (CAD) software tool. The feedback (hereafter also referred to as "design feedback") may provide the user with useful analysis information regarding the architectural structure's predicted characteristics (e.g., operational performance, resource consumption, cost, etc.) based on the current state of the computer-implemented design. As the user performs one or more actions on the computer-implemented design model (e.g., through the CAD software tool), particularly with respect to the geometry or texture of the computer-implemented design model, systems and methods can provide the impact of those actions, possibly at or near the time the actions were executed (e.g., at or near real-time). Actions by the user may result in modification of one or more design model elements of the computer-implemented design model. By providing (and updating) design feedback in this manner, the user may actively and immediately be informed of the impact their design change has on one or more predicted characteristics of the architectural structure and proceed accordingly. The design feedback may be provided automatically, based on modifications to the computer-implemented design model, without need for user to explicitly requesting analysis between modifications. In accordance with some embodiments the design feedback may be heating and cooling loads associated with the computer-implemented design of the architectural structure, which can be visually displayed to the user in real or near-real-time along with the relationships to contributing factors that impact the heating and cooling loads.

According to one embodiment, a method for displaying real-time impact analysis feedback of an architectural structure design comprises displaying pictorial representations of a heating load and a cooling load of the architectural structure design. The method further comprises displaying one or more building component contributors to the heating and cooling loads of the architectural structure design. For each of the one or more building component contributors to the heating load, a first visual connector is displayed, the first visual connector visually indicating an impact of each of the one or more building component contributors to the heating load of the architectural structure design. For each of the one or more building component contributors to the cooling load, a second visual connector is displayed, the second visual connector visually indicating an impact of each of the one or more building component contributors to the cooling load of the architectural structure design. Furthers still, the method comprises accepting input from a user, the input changing a parameter value of a building component contributor. In response to the input, and in real-time or near-real-time, the heating load representation, and the cooling load representation are simultaneously modified to reflect an impact of the change in the parameter value on the heating load and cooling load of the architectural structure design.

According to some embodiments of the disclosed technology, a computer program product comprises code configured to cause a computer system to perform various operations described herein. Additionally, some embodiments may be implemented using a computer system as described herein.

Other features and aspects of the disclosed technology will become apparent from the following detailed description, taken in conjunction with the accompanying drawings, which illustrate, by way of example, the features in accordance with embodiments of the disclosed technology. The summary is not intended to limit the scope of any inventions described herein, which are defined solely by the claims attached hereto.

BRIEF DESCRIPTION OF THE DRAWINGS

The technology disclosed herein, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

The figures are not intended to be exhaustive or to limit the invention described herein to the precise form disclosed. It should be understood that the invention can be practiced with modification and alteration, and that the disclosed technology be limited only by the claims and the equivalents thereof.

DESCRIPTION OF THE EMBODIMENTS

Various embodiments provide a user with design feedback regarding a computer-implemented design model, representing an architectural structure (e.g., office buildings, bridges, parking structures, shopping centers, etc.), as the user is designing or otherwise modifying the computer-implemented design using a computer-aided design software tool (e.g., a CAD tool). The design feedback may be provided automatically, based on modifications to the computer-implemented design model, without need for user to explicitly request analysis between modifications.

Figure 1:
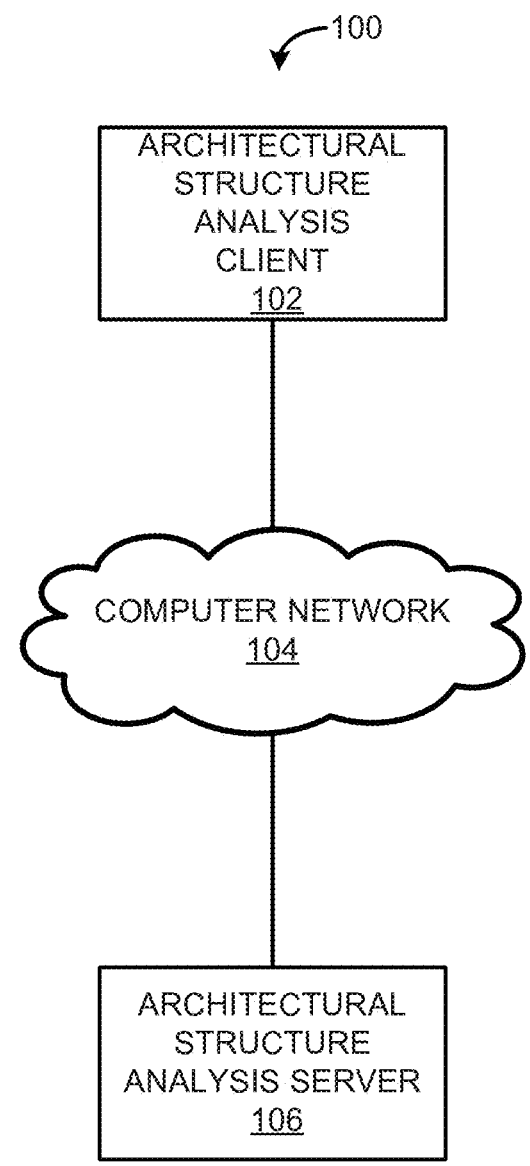
FIG. 1 is a block diagram illustrating an example architectural structure analysis system in accordance with some embodiments of the technology described herein.

FIG. 1 is a block diagram illustrating an example architectural structure analysis system in accordance with some embodiments of the technology described herein. In particular, FIG. 1 illustrates an example environment 100 in which various embodiments may operate. The example illustrated in FIG. 1 includes an architectural structure analysis client 102, an architectural structure analysis server 106, and a computer network 104. Computer network 104 may be configured to facilitate data communication between architectural structure analysis client 102 and architectural structure analysis server 106. The computer network 104 may comprise one or more network devices (e.g., switches, routers, and access points), networks (e.g., local-area networks [LANs], wide-area networks [WANs], and metropolitan-area networks [MANs]), and network links (e.g., wireless and wired links), which facilitate data communication between architectural structure analysis client 102 and architectural structure analysis server 106.

For some embodiments, each of architectural structure analysis client 102 and architectural structure analysis server 106 can respectively be implemented using one or more separate computer systems or modules. For example, while architectural structure analysis client 102 may be implemented in a user-oriented computer system, such as a desktop computing device or a mobile computing device (e.g., smartphone, tablet, and laptop), architectural structure analysis server 106 can be implemented on one or more server computing system, such as those generally used in providing cloud-based computing services. Those skilled in the art will appreciate that for some embodiments, architectural structure analysis client 102 and architectural structure analysis server 106 can be implemented as one or more processes operating on a single computer system without need of such a network as computer network 104.

Through architectural structure analysis client 102, a user, such as an architect, can access services, features, and functionality provided by architectural structure analysis server 106 in accordance with some embodiments. For instance, by way of a web-based service, an application program interface (API), or a software plug-in, architectural structure design software, such as a computer-aided design (CAD) software tool, can access the architectural structure analysis services provided by architectural structure analysis server 106. In accordance with some embodiments, the architectural structure design software may access the architectural structure analysis services as the architectural structure design software is used to design or modify a computer-implemented design model (e.g., CAD model) representing an architectural structure.

For example, consider a situation in which a computer-implemented design model representing an 3-dimensional architectural structure is accessed and modified by a user at architectural structure analysis client 102 using the architectural structure design software. Architectural structure analysis client 102 may provide architectural structure analysis server 106 with design model information relating to the computer-implemented design model, as the computer-implemented design model is accessed and modified. In accordance with some embodiments, the design model information provided may describe less than the entire computer-implemented design model at architectural structure analysis client 102. For instance, the design model information may be design model delta data that describes only one or more modifications performed to the computer-implemented design model at architectural structure analysis client 102.

Based on the design model information provided, architectural structure analysis server 106 can be configured to analyze the architectural structure and determine the impact of the modifications to the architectural structure. This can include, for example, the impact of modifications made to the computer-implemented design model at architecture structure analysis client 102 on one or more predicted characteristics of the architectural structure.

Architectural structure analysis server 106 can provide architectural structure analysis client 102 with analysis data regarding the impact of the modification (i.e., impact analysis data). Using the impact analysis data, architectural structure analysis client 102 can present the impact to the user through the architectural structure design software. The impact may, for example, be presented to the user as text-based or graphical information, which may be presented near (e.g., along-side) or overlaid onto design model elements of the computer-implemented design model as visually rendered.

In this way, the impact can be presented to the user as design feedback as the user accesses and modifies the computer-implemented design model through the architectural structure design software. In particular, the user modifies the computer-implemented design model through the architectural structure design software at architectural structure analysis client 102, and architectural structure analysis client 102 can provide the user with design feedback based on the modification of the computer-implemented design model, as facilitated by architectural structure analysis server 106. As one or more additional modifications are performed to the computer-implemented design model at architectural structure analysis client 102, architectural structure analysis client 102 can: (1) provide architectural structure analysis server 106 with design model information describing the additional modifications; (2) architectural structure analysis server 106 can provide architectural structure analysis client with the impact of the additional modifications to one or more predicted characteristics of the architectural structure; and (3) architectural structure analysis client 102 can present updated design feedback caused by the additional modifications.

Figure 2:
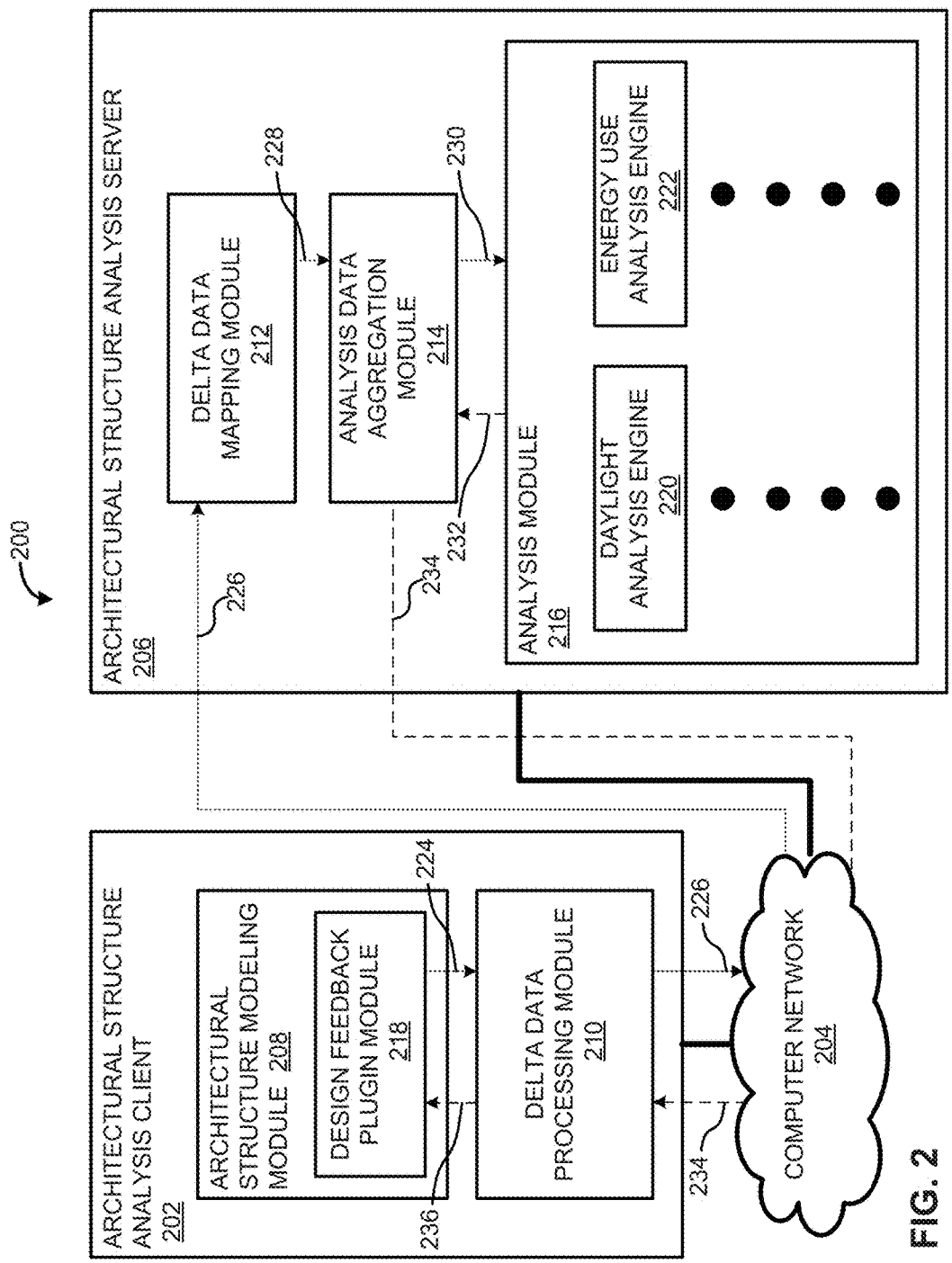
FIG. 2 is a block diagram illustrating an example architectural structure analysis system in accordance with some embodiments of the technology described herein.

FIG. 2 is a block diagram illustrating an example architectural structure analysis system in accordance with some embodiments of the technology described herein. In particular, FIG. 2 illustrates an example environment 200 that includes an architectural structure analysis client 202, an architectural structure analysis server 206, and a computer network 204 configured to facilitate data communication between architectural structure analysis client 202 and architectural structure analysis server 206. In accordance with some embodiments, architectural structure analysis client 202 may be similar to architectural structure analysis client 102 of FIG. 1, and architectural structure analysis server 206 may be similar to architectural structure analysis server 106.

The architectural structure analysis client 202 may be configured to: access a computer-implemented design model representing an architectural structure; modify the computer-implemented design model; provide design model delta data relating to the modification to the architectural structure analysis server 206; receive analysis data from the architectural structure analysis server 206 relating to the impact of the modifications to the architectural structure; and present the impact analysis data as design feedback. In the example of FIG. 2, the architectural structure analysis client 202 comprises an architectural structure modeling module 208 and a delta data processing module 210.

In the architectural structure analysis client 202, the architectural structure modeling module 208 may be configured to facilitate access, creation, or modification of a computer-implemented design model representing an architectural structure, such as a home, office building, parking structure, shopping center, or the like. The architectural structure modeling module 208 may enable a user at the architectural structure analysis client 202 to access, create, or otherwise modify the computer-implemented design model through a GUI configured to facilitate such operations. Through the architectural structure modeling module 208, the user may view a visual rendering of the computer-implemented design model and perform modifications via the visual rendering. In some embodiments, the architectural structure modeling module 208 may be implemented in whole or in part by a computer-aided design (CAD) software, such as Google® Sketch-up or Autodesk AutoCAD®.

To facilitate design feedback through the architectural structure modeling module 208, the architectural structure modeling module 208 may include a design feedback plugin module 218 compatible with the architectural structure modeling module 208. Where the architectural structure modeling module 208 is implemented by CAD software (e.g., Google® Sketch-Up®), the design feedback plugin module 218 may be one configured to be operable with the CAD software (e.g., Google® Sketch-Up® Plug-in). The design feedback plugin module 218 may be configured to capture actions performed on the computer-implemented design model by the user using the architectural structure modeling module 208. Depending on the embodiment, the design feedback plugin module 218 may communicate a current state of the computer-implemented design model when the design feedback plugin module 218 detects modification of the computer-implemented design model through the architectural structure modeling module 208. In the event that modeling events are not triggered automatically, the design feedback plugin module 218 may monitor for modifications to the computer-implemented design model. As described herein, modification of a computer-implemented design model may include a change in the geometry, position, orientation, surface texture, color, or some other property of a design model element of the computer-implemented design model. As also described herein, design model elements may include lines, color, surface texture, face and planes in a three-dimensional space. The design elements in the computer-implemented design model may be intended to represent features of an architectural structure, such as walls, floors, windows, roofs, and fenestrations.

The design feedback plugin module 218 may further facilitate communication data between the architectural structure modeling module 208 and the architectural structure analysis server 206. As a user utilizes the architectural structure modeling module 208 to design or modify a computer-implemented design model, the design feedback plugin module 218 can output design information 224 relating to the current state of the computer-implemented design model for design feedback analysis by the architectural structure analysis server 206. The design feedback plugin module 218 may further receive analysis data relating to an impact of the current state of the computer-implemented design model on a predicted characteristic of the architectural structure, where the current state of the computer-implemented design model a modified version of the computer-implemented design model.

For some embodiments, the design feedback plugin module 218 may access the services of the architectural structure analysis server 206 by way of sign-on process. A successful sign-on may permit the architectural structure modeling module 208 to utilize the design feedback provided by the architectural structure analysis server 206.

To avoid having to send the entire current computer-implemented design model to architectural structure analysis server 206, architectural structure analysis client 102 may utilize the delta data processing module 210 to receive the output design information 224 relating to the current state of the computer-implemented design model and generate, based on the output design information 224, design model delta data 226 reflecting the one or more design differences between a previous state of the computer-implemented design model (e.g., before modification through the architectural structure modeling module 208) and current state of the computer-implemented design model (e.g., after modification through the architectural structure modeling module 208). The design differences may include a change to a property of a design model element of the computer-implemented design model. The design model delta data 226 produced by the delta data processing module 210 can be provided to architectural structure analysis server 106 to facilitate design feedback.

To illustrate examples of design model delta data, consider TABLE 1 below, which lists before and after design data for a computer-implemented design model representing an architectural structure.

TABLE 1

| DESIGN DATA BEFORE MODIFICATION | DESIGN DATA AFTER MODIFICATION |
| --- | --- |
| { | { |
| "north_glazing_component": 0, | "north_glazing_component": 0, |
| "south_glazing_component": 0, | "south_glazing_component": 35, |
| "east_glazing_component": 0, | "east_glazing_component": 0, |
| "west_glazing_component": 0, | "west_glazing_component": 0, |
| "total_glazing_area": 0, | "total_glazing_area": 35, |
| "total_wall_area": 280, | "total_wall_area": 245, |
| "total_floor_area": 100.0, | "total_floor_area": 100.0, |
| "ground_floor_area": 100.0, | "ground_floor_area": 100.0, |
| "building_height": 7.0, | "building_height": 7.0, |
| "location": "NYC", | "location": "NYC", |
| "spaceUseType": "Office" | "spaceUseType": "Office" |
| } | } |

The design model delta data may comprise the following design data, reflecting the change to deign model elements between the previous state and the current state of the computer-implemented design model: {"south_glazing_component": 35, "total_glazing_area": 35, "total_wall_area": 245}.

Additionally, to determine the change in impact on a predicted characteristic of the architectural structure as result of the current state of the computer-implemented design model, the architectural structure analysis client 202 may utilize the delta data processing module 210, which may receive impact analysis data 234 from the architectural structure analysis server 206 and provide to the architectural structure modeling module 208 (e.g., through the design feedback plugin module 218) impact delta data 236 reflecting the change in impact.

By facilitating the movement of incremental information (e.g., design model delta data 226, and impact delta data 236), the delta data processing module 210 can minimize data that needs to be move to and from the modeling environment at the architectural structure analysis client 202. For some embodiments, the minimization of information improves or otherwise facilitates the architectural structure analysis client 202 receiving design feedback at or near the time that changes are applied to a computer-implemented design model.

The architectural structure analysis server 206 can be configured to: receive from the architectural structure analysis client 102, design model delta data relating to a modification to a computer-implemented design model representing an architectural structure; analyze the impact of the modification on one or more predicted characteristics of the architectural structure; and provide analysis data relating to the impact to the architectural structure analysis client 102. In the example of FIG. 2, the architectural structure analysis server 206 comprises a delta data mapping module 212, an analysis data aggregation module 214, and an analysis model 216.

The delta data mapping module 212 may be configured to receive the design model delta data 226 from the architectural structure analysis client 102, and map (e.g., interpret) the design model delta data 226 to building delta data. The architectural structure analysis server 206 may possess building data representing the architectural structure that is represented by the computer-implemented design model at the architectural structure analysis client 202. Accordingly, the building delta data may be configured to modify the building data at the architectural structure analysis server 206 to represent the architectural structure as the architectural structure is represented by the current state of the computer-implemented design model at the architectural structure analysis client 202. In particular, the delta data mapping module 212 may parse the design model delta data 226 and combine the parsing results with the last version of the building data to produce a current version of the building data 228. The delta data mapping module 212 may provide the building data 228 to the analysis data aggregation module 214 to perform analysis on the architectural structure represented by the current version of the building data 228. By its operations, the delta data mapping module 212 may facilitate the tagging geometry data, from a computer-aided design (CAD) software tool, to building data for impact analysis, and may obviate the need for a user to perform such operations manually. Depending on the embodiment, the current version of the building data 228 may be implemented according to a standard format, such as COLLADA™, which defines an XML-based schema to make it easy to transfer three-dimensional assets between computer processes.

Those skilled in the art will appreciate that in some embodiments, the architectural structure analysis server 206 may maintain a local version of the computer-implemented design model, utilize the design model delta data 226 to modify the local version of the computer-implemented design model at the architectural structure analysis server 206, and map the resulting modified version of the computer-implemented design model to the building data 228. Those skilled in the art will also appreciate that other methods of delivering geometry data (e.g., of the computer-implemented design model) from the architectural structure analysis client 202 to the architectural structure analysis server 206, or mapping the geometry data to building data may exist in some embodiments.

In some embodiments, the delta data mapping module 212 may be configured to map design data to building delta data in accordance with one or more rules that define such mapping. For various embodiments, the architectural structure analysis server 206 may comprise a set of default rules determining the behavior of the delta data mapping module 212. For certain embodiments, one or more of the rules (e.g., default rules) may be overridden by a user-defined rule. A given rule may or may not define whether a user-defined rule may override the definition of the given rule.

Table 2 below provides some example rules configured to determine the behavior of the delta data mapping module 212. As these rules are merely examples, those skilled in the art will appreciate that in some embodiments, the rules may be different in number and definition from the rules provided below.

TABLE 2

| | RULE | SPECIFICS |
|---|---|---|
| 1 | Material Transparency Consistency Rule | A face with no material attached or with material of 1.0 alpha value will be recognized as "Wall" or "Roof Candidates" |
| | | A face with no material attached or with material of alpha value less than 1.0 will be recognized as "Window" or "SkyLight Candidates" |
| | | One cannot override a "Transparent Window" into "Non-Transparent Wall," or vice versa. |
| | | A face with material attached will only have front material mapped. |
| 2 | Tilt Angle Consistency Rule | "Tilt Angle" is defined as the angle formed between any line on a face that does not parallel to the X-Y plane with the X-Y plane; tilt angle can range [0, 180] degree. |
| | | If the Tile Angle of a face is: (1) <=10 degree or >=170 degree, the face is recognized as a "Floor Candidate"; (2) >10 degrees but <30 degrees, or >150 degrees but <170 degrees; or (3) >10 degrees but <30 degrees, the face is recognized as a "Roof" or "Skylight Candidate". |
| | | If the Tile Angle of a face is >=150 degrees but >=30 degrees, the face is recognized as a "Window" or "Wall Candidate". |
| | | If the Tile Angle of a face is: (1) 0 or 180 degrees, it can never be overridden as a Winnow or Wall; and (2) 90 degrees, it a Window or Wall and cannot be overridden to be otherwise. |
| | | If the Tile Angle of a face is a "Floor Candidate" it can never be set to a Floor via overriding. |

TABLE 2-continued

| | RULE | SPECIFICS |
|---|---|---|
| 3 | Touching Ground Rule | No Footprint and No Floor Areas will be reported unless a design model touches or stride through Z = 0 ground plane; or a Sloping Ground Plane is defined.<br>No Massing will be reported if a building is completely above ground or below ground by more than 50 cm margin. |
| 4 | Below Ground Rule | An Underground Structure is treated the same as being above ground. Accordingly, if a user draws a window at below ground, it will still be recognized as window. |
| 5 | Floor #1 Always at Z = 0 | If a building has below-ground structure, it could have below ground floor(s) numbered as −1, −2, . . . ; but Floor #1 is always at Z = 0. |
| 6 | Default Calculated Floor(s) Must Meet Overhead Floor-to-Ceiling Height. In case of Uneven Ceiling, the aggregate covering area of ceiling(s) that are within 3.5 meter of the Floor must be no more than 50% of the covered Floor Area. | In the absence of recognized user-added floor(s), all floors must have a minimum default floor-to-floor height of 3.5 meter. |
| 7 | Window Must be Drawn and cannot be left hollow. No Window, No Glazing, No Glazing Ratio, possibly no Floor(s). | |
| 8 | Hidden Design model elements will not be Recognized | |
| 9 | Mapping will Bail out Early on Excessive Complexity | If the density of plane count exceed an aggregate average of 10 plane per inch of building height, the mapping will bail out and no further output will be produced.<br>For example, a building with 5 meter height, approximately 200 inches, when the plane # count reaches 2,000, the parsing will stop. Think about it, 2000 planes for a Flat. |
| 10 | Until the internal structure is identified, the mapping will operate under the assumption of "No Internal Plane". | "Internal Planes" are defined as internal building structures that cannot been seen from any point beyond building bounding box except perhaps their edges or vertices if all windows were opaque", shall NOT be present in the model (except in the case a User-Added Floor)<br>Internal Planes can affect accuracy of floor area calculation, adding more area or remove some/all area. |
| 11 | All "Intersecting Faces" in the design model must be made to be "Physically Intersecting" via "Intersecting Faces" property. | |
| 12 | A User-Placed Floor (or User-Added Floor) is defined as "Floor Candidate" Plane which is strictly "Internal" Plane, except when an Non-Internal "Floor Candidate" is overridden as "Floor" (when it will be regarded as "User-Placed Floor") | |
| 13A | Overhanging Floor becomes a Floor | The plane as the bottom of an overhang structural feature is NOT recognized as a floor, unless its floor area is >90% of the cross section area of the building at the same height. |
| 13B | Overhanging Floor becomes a Floor | The plane as the bottom of an overhang structural feature is recognized as a floor: (1) when a user explicitly places a floor plane inside this bottom plane of the overhand structural feature, and (2) if the aggregate area of both overhanging bottom and inside floor is >30% of the cross section area of the building at the same height. |

TABLE 2-continued

| RULE | | SPECIFICS |
|---|---|---|
| 13C | Overhanging Floor becomes a Floor | The plane as the bottom of an overhang structural feature is recognized as a floor: (1) when a user explicitly places a floor plane inside this bottom plane of the overhand structural feature, but (2) the user-added floor plane is not large and does not cover the entire part of the supposed floor, if the aggregate area of both overhanging bottom and inside floor is >30% of the cross section area of the building at the same height. |
| 13D | Overhanging Floor becomes a Floor | The plane as the top of an overhang structural feature is NOT recognized as a floor, regardless if there is an explicitly-placed floor plane at the same level by a user. |
| 13E | Overhanging Floor becomes a Floor | The plane as the bottom of an overhang structural feature is recognized as a floor: when it is big enough, reaching 90% of the area of a supposed floor plane at this Z level, it IS recognized as a floor plane. |
| 14 | Only Detect One User-Added Floor When Setting a Floor as Precedent to Default floor(s) | |
| 15A | Shading and Overhang Recognition | External Building Planes: planes (1) that do not intersect with building floors if such a floor exists, (2) that exist at the same Z-level or range as other "external planes", or (3) that intersects at no more than a few points and never intersect with building floors to form any line, and (4) cannot be seen from any point of a building floor if all window were opaque. |
| 15B | Shading and Overhang Recognition | Pure Shading (in short, Shading): external building planes that do not form any enclosing space/volume with themselves or with other building planes |
| 15C | Shading and Overhang Recognition | Overhang: external building planes that form enclosing space/volume that is however non-livable due to limited head space or floor space |

The analysis data aggregation module 214 may be configured to receive the current version of the building data 228, and send some or all of the building data 230 to one or more analysis engines of the analysis module 216, which may be configured to analyze the architectural structure based on the building data 230 it receives. By sending some or all of the building data 230 to various analysis engines, analysis data aggregation module 214 may delegate/distribute the analysis workload for the architectural structure and perform different types of analysis in parallel. The various analysis engines may be implemented using cloud-based resources and may utilize queuing mechanisms built into such resources.

As shown in FIG. 2, the analysis module 216 may comprise a daylight analysis engine 220 configured to analyze the potential amount of daylight the architectural will receive based on some or all of the building data 230. The analysis module 216 may also comprise an energy use analysis engine 222 configured to determine the predicted energy use of the architectural structure based on some or all of the building data 230. Results 232 of the analysis may be returned to the analysis data aggregation module 214, which may aggregate the results and coalesce the results to produce the impact analysis data 234 for the architectural structure analysis client 202. For some embodiments, the results 232 may be integrated results, combining results regarding multiple characteristics of the architectural structure (e.g., daylighting, energy use, water use, etc.), possibly without manual selection by a user. As described herein in further detail, the impact analysis data 234 may relate to an impact on a predicted characteristic of the architectural structure based on the modification performed at the architectural structure analysis client 202, which resulted in the current state of the computer-implemented design model and the output design information 224 related thereto.

When performing analysis of an architectural structure, the analysis module 216 may take into consideration various settings provided by the user at the architectural structure analysis client 202 including, for example, the use type of the architectural structure (e.g., residence, business, hospital, etc.) and the intended geographic location for architectural structure (e.g., city, state, country, continent, elevation latitude and longitude, etc.). Based on the settings, the analysis module 216 may obtain or utilize geography related data (e.g., weather, temperature, rainfall, resource availability) in its analysis of the architectural structure.

Figure 3:
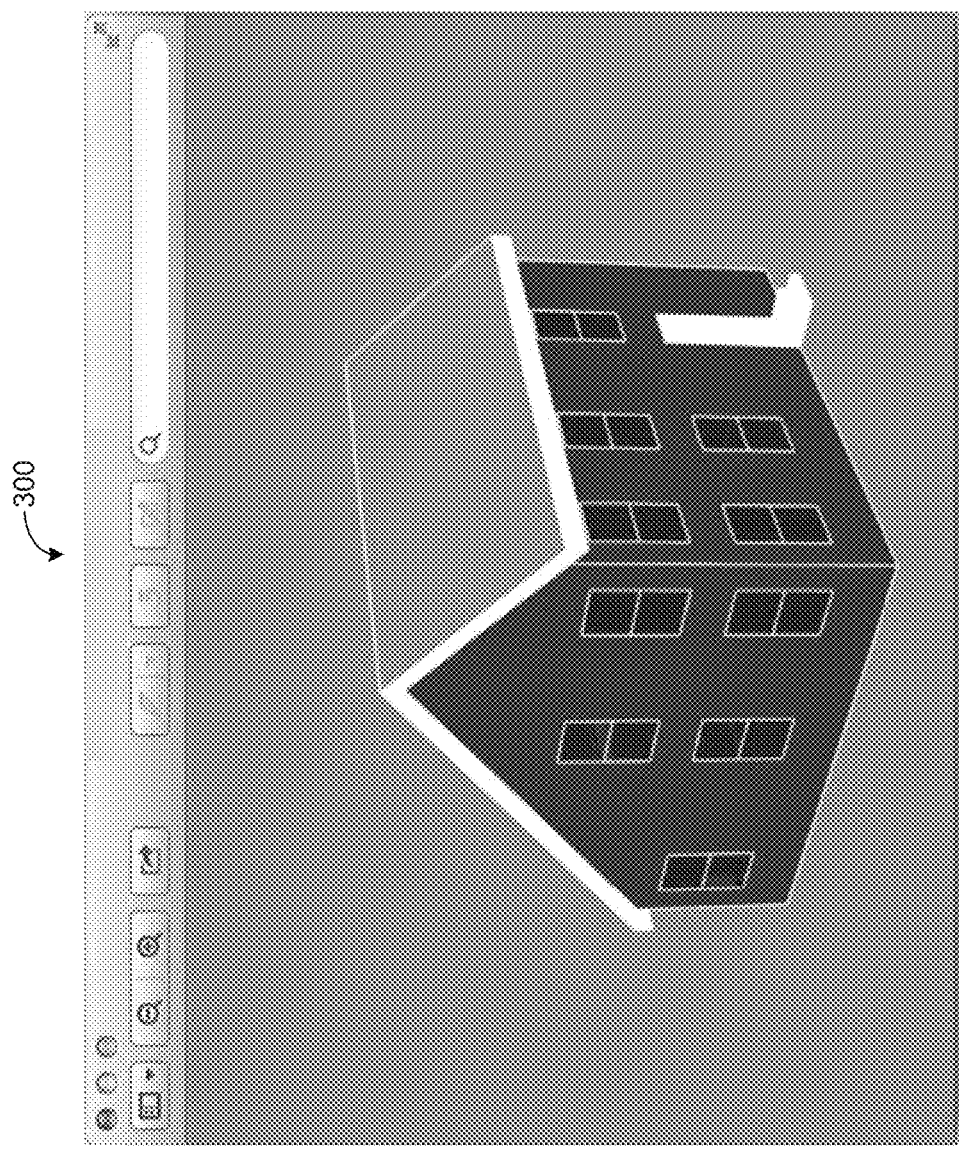
FIG. 3 is a visual rendering of an example computer-implemented design model representing an example architectural structure in accordance with some embodiments of the technology disclosed herein.

FIG. 3 provides a visual rendering 300 of an example computer-implemented design model representing an example architectural structure in accordance with some embodiments of the technology disclosed herein. As described herein, the architectural structure modeling module 208 may access and visually present the visual rendering 300 to a user for the user to modify various design model elements of the architectural structure represented.

Figure 4:
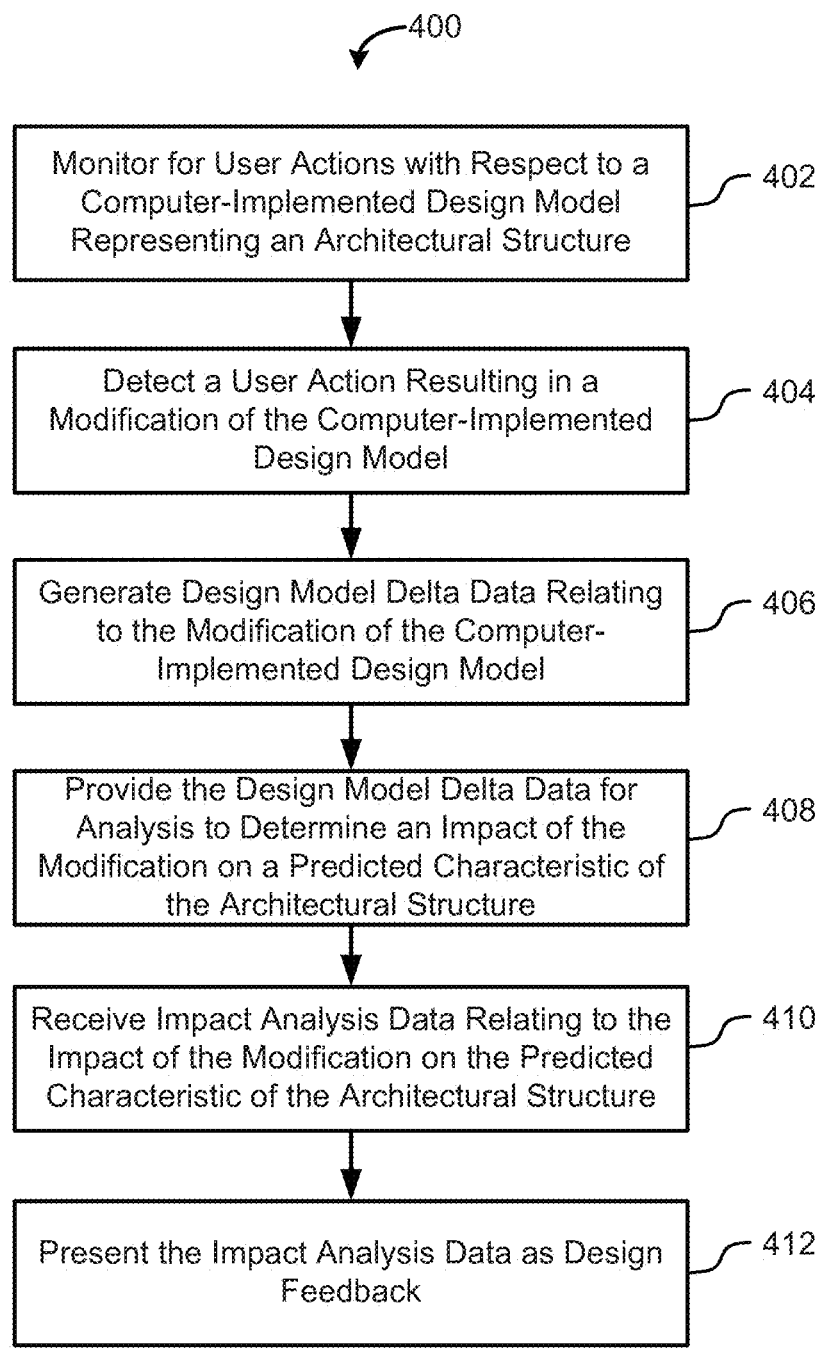
FIG. 4 is a flowchart illustrating an example method for analyzing an architectural structure in accordance with some embodiments of the technology disclosed herein.

FIG. 4 is a flowchart illustrating an example method 400 for analyzing an architectural structure in accordance with some embodiments of the technology disclosed herein. According to some embodiments, the method 400 may be one performed by the architectural structure analysis client 202 as user accesses a computer-implemented design model through the architectural structure analysis client 202.

As shown in FIG. 4, the method 400 may begin at operation 402 with user actions being monitored with respect to a computer-implemented design model representing an architectural structure. For instance, the design feedback plugin module 218 may monitor user actions with respect to a computer-implemented design model being accessed by a user through the architectural structure modeling module 208.

At operation 404, a user action may be detected where the detected user action results in a modification of the computer-implemented design model. For example, the design feedback plugin module 218 may detect when a user action results in a modification of a computer-implemented design model being access by a user through the architectural structure modeling module 208, thereby resulting in the current state of the computer-implemented design model.

Subsequently, at operation 406, design model delta data may be generated relating to the modification of the computer-implemented design model. In one example, the delta data processing module 210 may generate design model delta data from the current state of computer-implemented design model, which may be modified in comparison to the previous state of the computer-implemented design model. At operation 408, the design model delta data generated at operation 406 may be provided for analysis to determine an impact of the modification on a predicted characteristic of the architectural structure. For instance, the delta data processing module 210 may provide design model delta data to the architectural structure analysis server 206 for impact analysis on the predicted characteristic of the architectural structure.

At operation 410, impact analysis data may be received relating to the impact of the modification on the predicted characteristic of the architectural structure. For instance, the architectural structure analysis client 202 may receive the impact analysis data from the architectural structure analysis server 206 in response to the delta data processing module 210 providing the design model delta data to the architectural structure analysis server 206. The impact analysis data can be presented as design feedback at operation 412. In some examples, the design feedback plugin module 218 may be present the impact analysis data as design feedback at or near the computer-implemented design model being accessed through the architectural structure modeling module 208.

Figure 5:
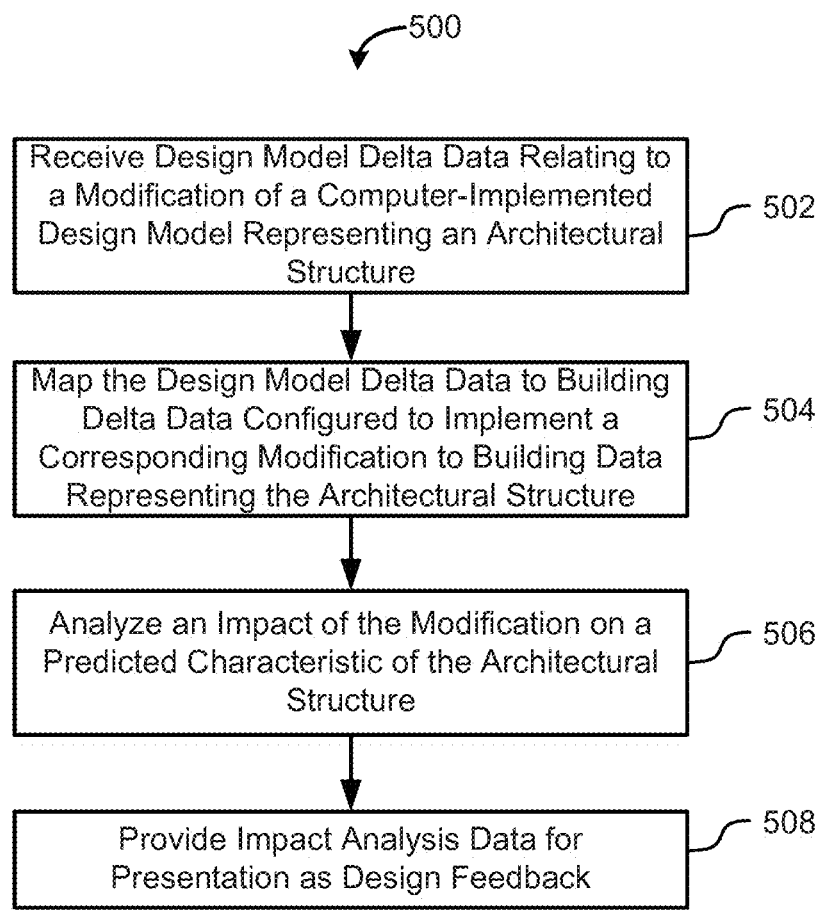
FIG. 5 is a flowchart illustrating an example method for analyzing an architectural structure in accordance with some embodiments of the technology disclosed herein.

FIG. 5 is a flowchart illustrating an example method 500 for analyzing an architectural structure in accordance with some embodiments of the technology disclosed herein. According to some embodiments, the method 500 may be one performed by the architectural structure analysis server 206 as user accesses a computer-implemented design model at the architectural structure analysis client 202, and the architectural structure analysis client 202 provides data relating to the modifications performed to a computer-implemented design model to the architectural structure analysis server 206.

As shown in FIG. 5, the method 500 may begin at operation 502 with design model delta data being received, where the design model delta data relates to a modification of a computer-implemented design model representing an architectural structure.

At operation 504, the design model delta data may be mapped to building delta data configured to implement a corresponding modification to building data representing the architectural structure. For example, the delta data mapping module 212 may map design model delta data received from the architectural structure analysis client 102 to building data.

At operation 506, an impact of the modification on a predicted characteristic of the architectural structure may be analyzed. In one example, the analysis data aggregation module 214 and the analysis module 216 may receive the building data produced based on the building delta data and analyze the architectural structure represented by the building data.

At operation 508, impact analysis data may be provided for presentation as design feedback. In an example, the analysis data aggregation module 214 and the analysis module 216 may provide impact analysis data to the architectural structure analysis client 202, which may present the impact analysis data as design feedback.

Figure 6A:
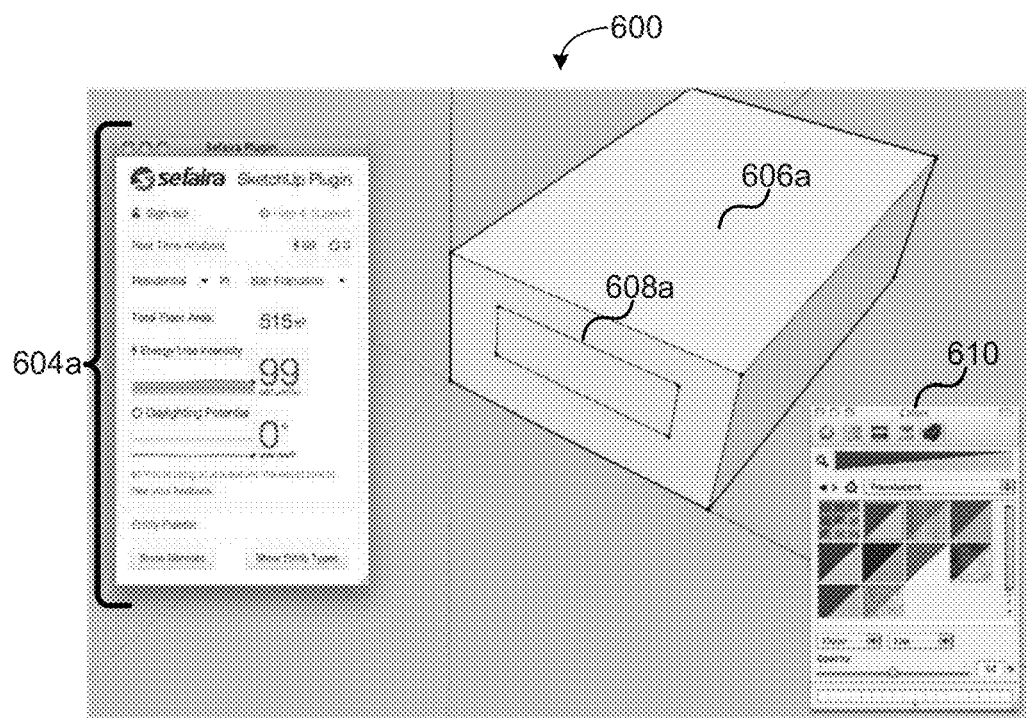
FIGS. 6A and 6B provide screenshots illustrating design feedback during design a computer-implemented design model representing an example architectural structure in accordance with some embodiments of the technology disclosed herein.
Figure 6B:
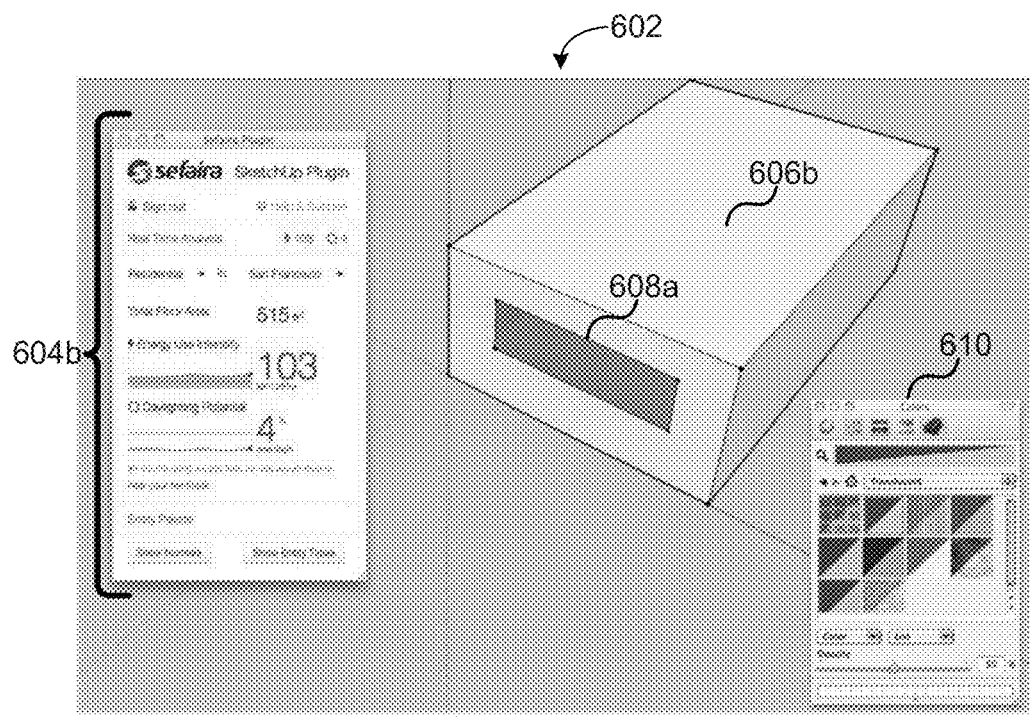

FIGS. 6A and 6B provide screenshots 600 and 602 illustrating design feedback during design using a computer-implemented design model representing an example architectural structure in accordance with some embodiments of the technology disclosed herein. In particular, the screenshots 600 and 602 may be of an example GUI of an example CAD software accessing the computer-implemented design model.

In screenshot 600, a computer-implemented design model 606a, having a non-textured design model element 608a, is visually rendered. Near the visual rendering of the computer-implemented design model 606a, a plugin GUI panel 604a is presented, which may be configured to present design feedback for the current configuration of the computer-implemented design model 606a (e.g., energy usage at 99 kBTU/ft$^2$/yr, 0% of the interior area that is lit by daylight). In screenshot 602, the non-textured design model element 608a of computer-implemented design model 606a is modified to be a textured design model element 608b of a computer-implemented design model 606b (e.g., where the texture represents a window, causing energy usage to be 103 kBTU/ft$^2$/yr and 4% of the interior area being lit by daylight). As a result of the modification, a plugin GUI panel 604b presents the updated design feedback reflecting the configuration of the computer-implemented design model 606b. According to some embodiments, a texture GUI panel 610 can facilitate changing the surface texture of various design model elements of computer-implemented design models.

Figure 7:
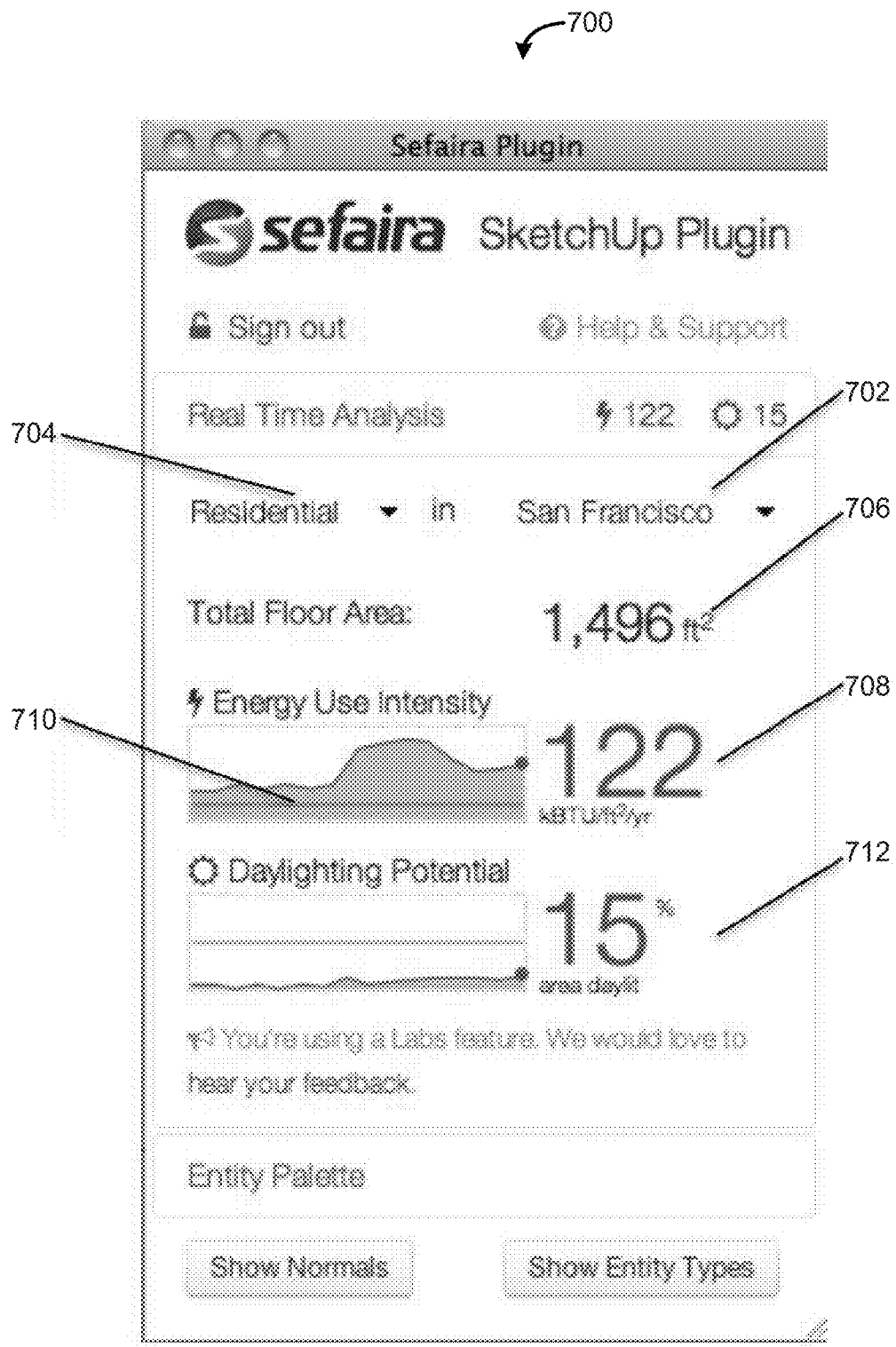
FIG. 7 provides a screenshot of an example graphical-user interface (GUI) panel for architectural structure analysis in accordance with some embodiments of the technology disclosed herein.
Figure 8A:
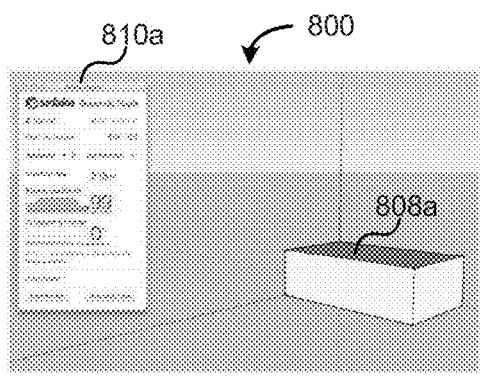
FIGS. 8A-8D provide screenshots illustrating design feedback during design of a computer-implemented design model representing an example architectural structure in accordance with some embodiments of the technology disclosed herein.
Figure 8B:
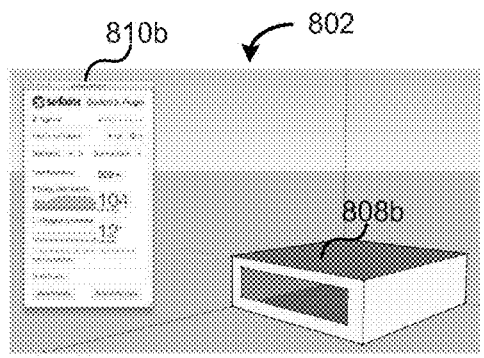
Figure 8C:
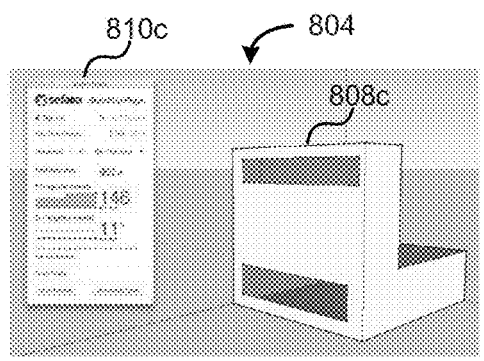
Figure 8D:
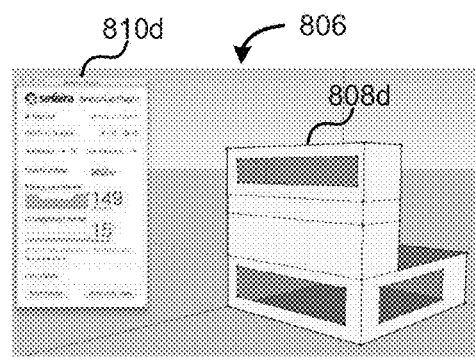

FIG. 7 provides a screenshot 700 of an example GUI panel for architectural structure analysis in accordance with some embodiments of the technology disclosed herein. In particular, the screenshot 700 may be of an example GUI panel presented through an example CAD software accessing the computer-implemented design model. According to some embodiments, the GUI panel of FIG. 7 may provide for features that enable a user at a CAD software tool to sign-on to the design feedback services provided by an architectural structure analysis server. The GUI panel of FIG. 7 may further provide for control of the design feedback feature, and presentation of design feedback. For example, through the GUI panel of FIG. 7, a user can view and change the intended geographic location 702 of the architecture structure represented by the current computer-implemented design model. Additionally, a user may view and change the intended use type 704 of the architecture structure represented by the current computer-implemented design model. The GUI panel of FIG. 7 may present various characteristics of the architectural structure represented by the current computer-implemented design model including, for example, square footage 706 of the architecture structure, energy use 708 by the architectural structure, and area 712 of the architecture structure that is lit by daylight. A benchmark indicator 710 may graphically present a benchmark trying to be attained for the architectural structure. The benchmark indicator 710 may be according to a standard, certification or rating, including such green building certification and rating systems as Leadership in Energy & Environmental Design (LEED®) and Code for Sustainable Homes (CSH), and Building Research Establishment Environment Assessment Method (BREEAM).

FIGS. 8A-8D provide screenshots 800, 802, 804, and 806 illustrating design feedback during design of a computer-implemented design model representing an example architectural structure in accordance with some embodiments of the technology disclosed herein. In particular, the screenshots 800, 802, 804, and 806 may be of an example GUI of an example CAD software accessing the computer-implemented design model. The screenshots 800, 802, 804, and 806 illustrate how modifications to the computer-implemented design model 808a over multiple iterations (e.g., 808b, 808c, and 808d) can cause design feedback being provided through the GUI panel 810a to change after each iteration (e.g., 810b, 810c, and 810d).

Figure 9A:
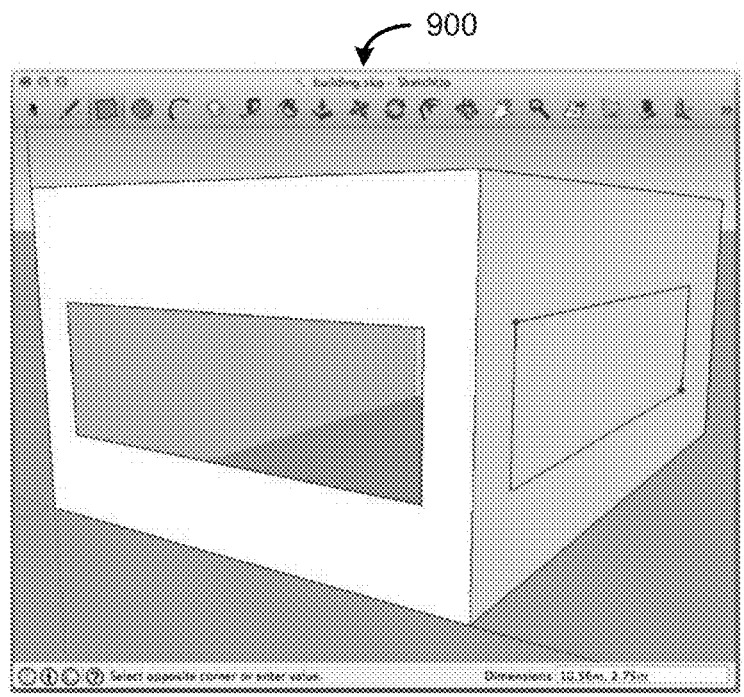
FIGS. 9A and 9B provide screenshots illustrating an example of modifying a computer-implemented design model representing an example architectural structure in accordance with some embodiments of the technology disclosed herein.
Figure 9B:
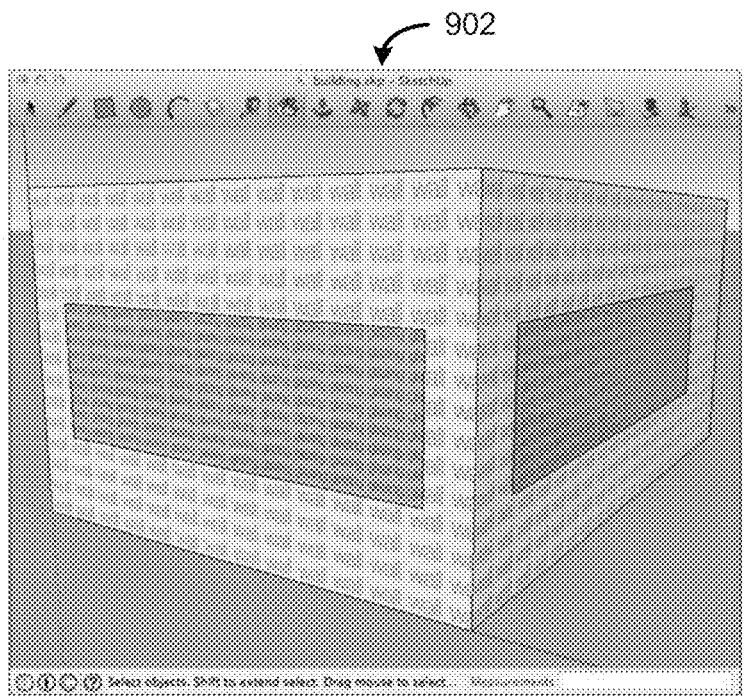

FIGS. 9A and 9B provide screenshots 900 and 902 illustrating an example of modifying a computer-implemented design model representing an example architectural structure in accordance with some embodiments of the technology disclosed herein. In particular, the screenshots 900 and 902 may be of an example GUI of an example CAD software accessing the computer-implemented design model. In screenshot 900, the computer-implemented design model is presented as visually rendered. In screenshot 902, the same the computer-implemented design model is also presented visually rendered with the entity of each design model element being shown. As used herein, an "entity" may identify building elements represented by design model elements in a computer-implemented design model. Examples of entities can include, without limitation, glazing, walls, roofs, floors, internals walls, and party walls. In some embodiments, the visual feedback may include information regarding the entity of each design model element, as automatically identified/recognized by an architectural structure analysis server (e.g., according to the rules that determine the behavior of the delta data mapping module 212). In some embodiments, the entity can be overridden by user action through the CAD software accessing the computer-implemented design model.

Figure 10:
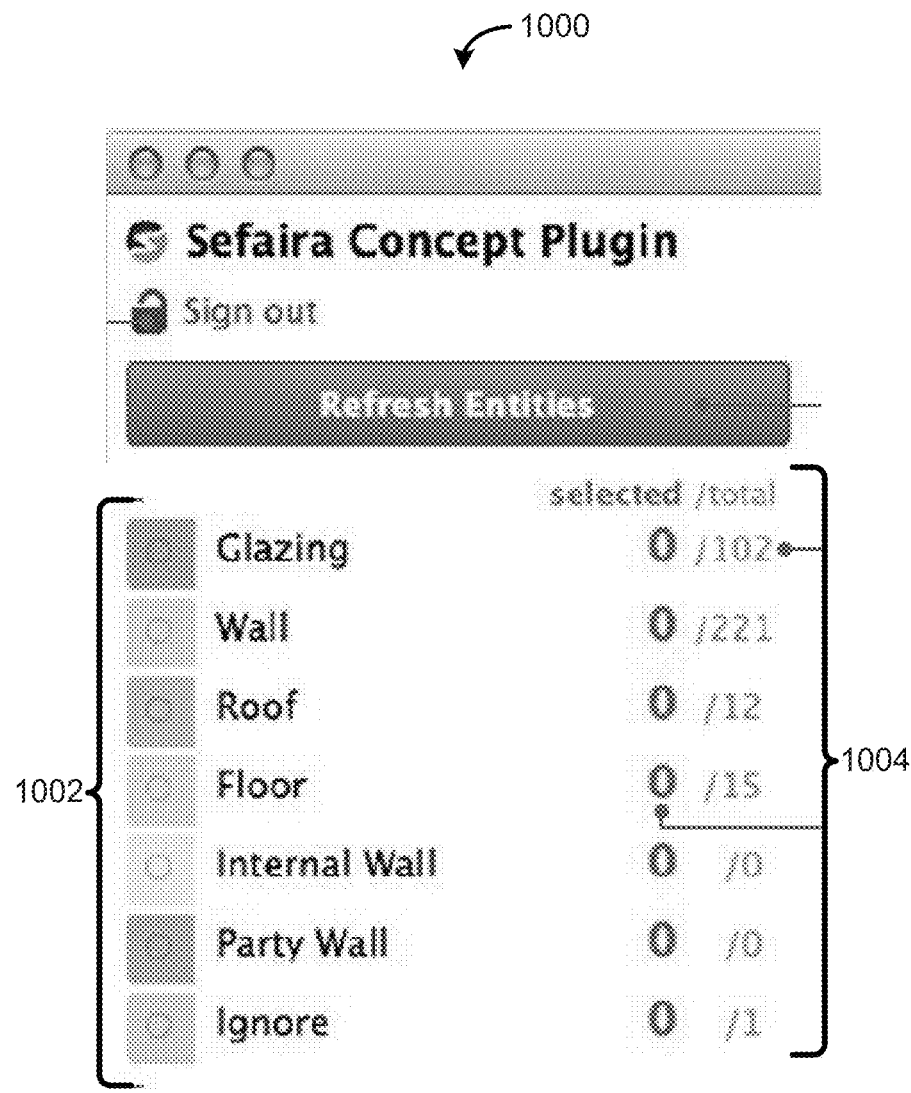
FIG. 10 provides a screenshot of an example GUI panel for modifying a computer-implemented design model representing an example architectural structure in accordance with some embodiments of the technology disclosed herein.

FIG. 10 provides a screenshot 1000 of an example GUI panel for modifying a computer-implemented design model representing an example architectural structure in accordance with some embodiments of the technology disclosed herein. In particular, the screenshot 1000 may be of an example GUI panel presented through an example CAD software accessing the computer-implemented design model. As shown, the GUI panel of FIG. 10 lists the various entity categories 1002 can exist for a current computer-implemented design model, and list the number 1004 of such entities presented in the current computer-implemented design model. For some embodiments, the GUI panel of FIG. 10 may facilitate controlling how certain design model elements are identified as entities.

Figure 11:
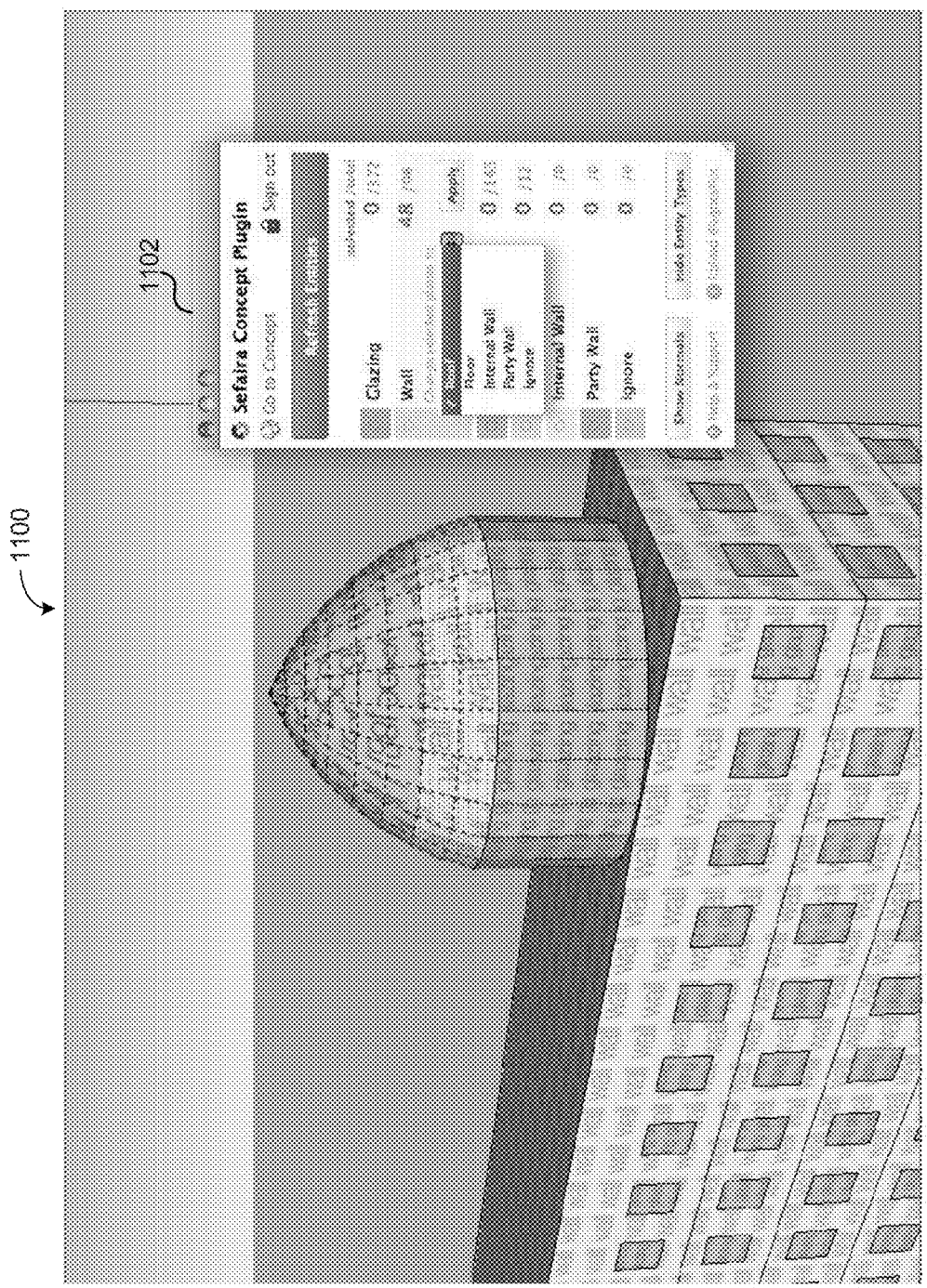
FIG. 11 provides a screenshot illustrating an example of modifying a computer-implemented design model representing an example architectural structure in accordance with some embodiments of the technology disclosed herein.
Figure 12A:
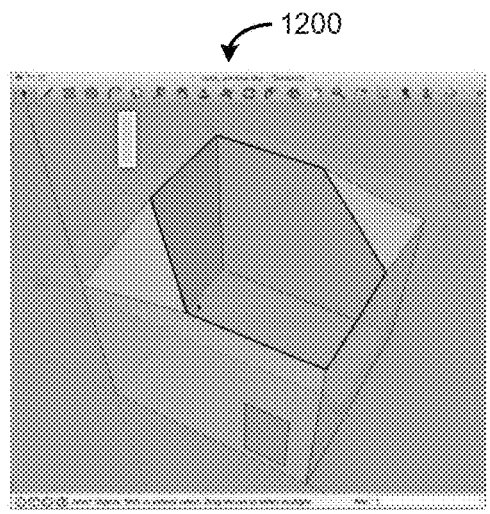
FIGS. 12A-12D provide screenshots illustrating visual design feedback during design of a computer-implemented design model representing an example architectural structure in accordance with some embodiments of the technology disclosed herein.
Figure 12B:
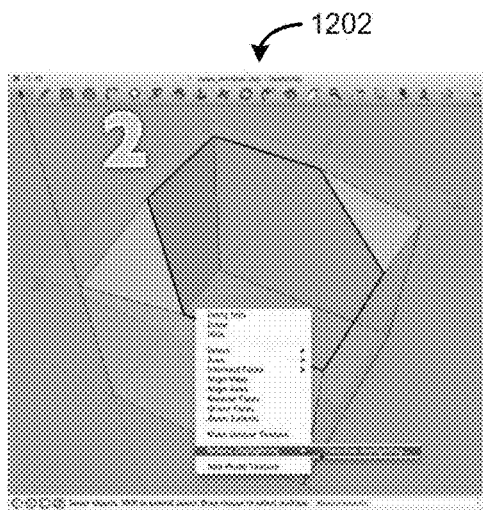
Figure 12C:
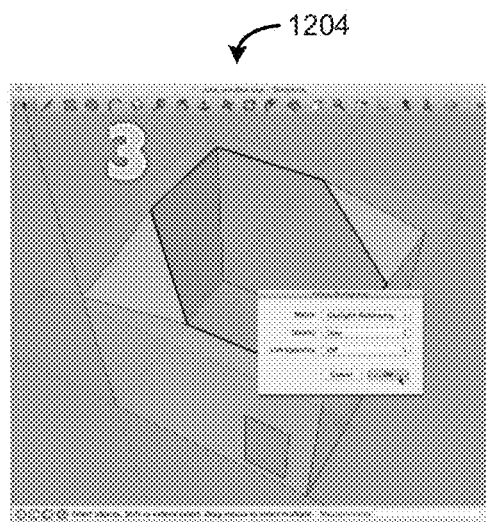
Figure 12D:
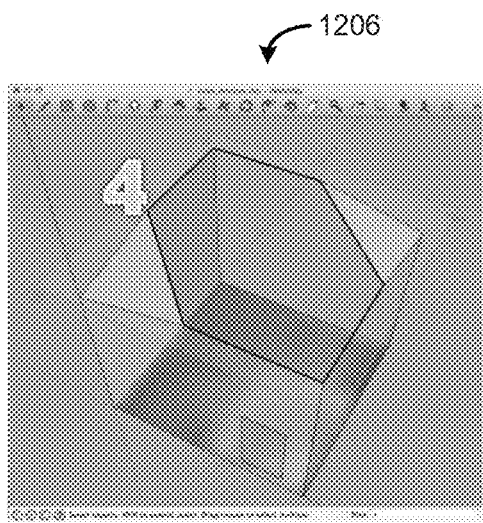

FIG. 11 provides a screenshot 1100 illustrating an example of modifying a computer-implemented design model representing an example architectural structure in accordance with some embodiments of the technology disclosed herein. In particular, the screenshot 1100 may be of an example GUI of an example CAD software accessing the computer-implemented design model. In screenshot 1100, a GUI panel 1102 is presented as facilitating an override of the identified entity of a selected design model element.

FIGS. 12A-12D provide screenshots 1200, 1202, 1204, and 1206 illustrating visual design feedback during design of a computer-implemented design model representing an example architectural structure in accordance with some embodiments of the technology disclosed herein. In particular, the screenshots 1200, 1202, 1204, and 1206 may be of an example GUI of an example CAD software accessing the computer-implemented design model. Screenshots 1200, 1202, 1204, and 1206 illustrate how a user selects a plane (e.g., a floor) and selects to view a daylighting factor heat map as design feedback based of the current computer-implemented design model. As shown, the selection of the daylighting factor heat map can be mapped to the visual rendering of the current computer-implemented design model. In accordance with some embodiments, any subsequent modification to the computer-implemented design model may result in the daylighting factor heat map changing.

Figure 13A:
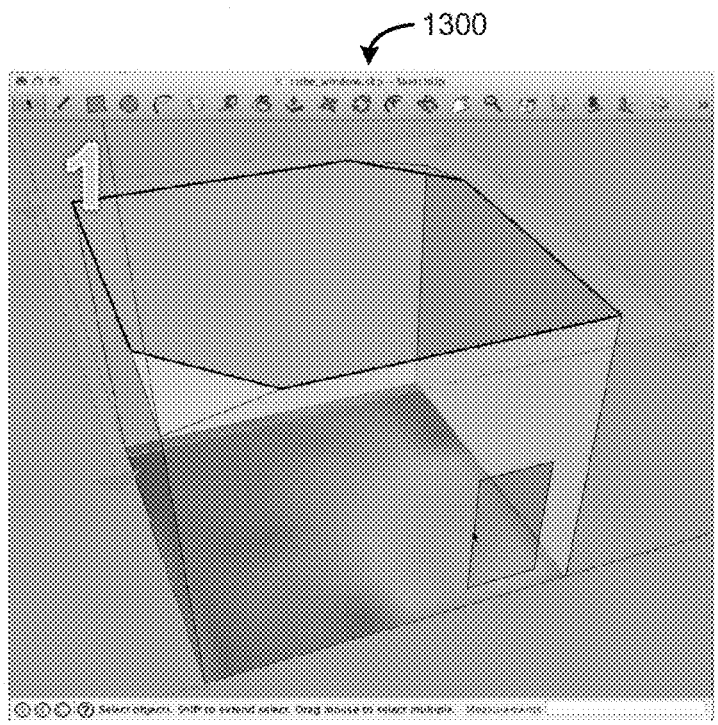
FIGS. 13A and 13B provide screenshots illustrating visual design feedback during design of a computer-implemented design model representing an example architectural structure in accordance with some embodiments of the technology disclosed herein.
Figure 13B:
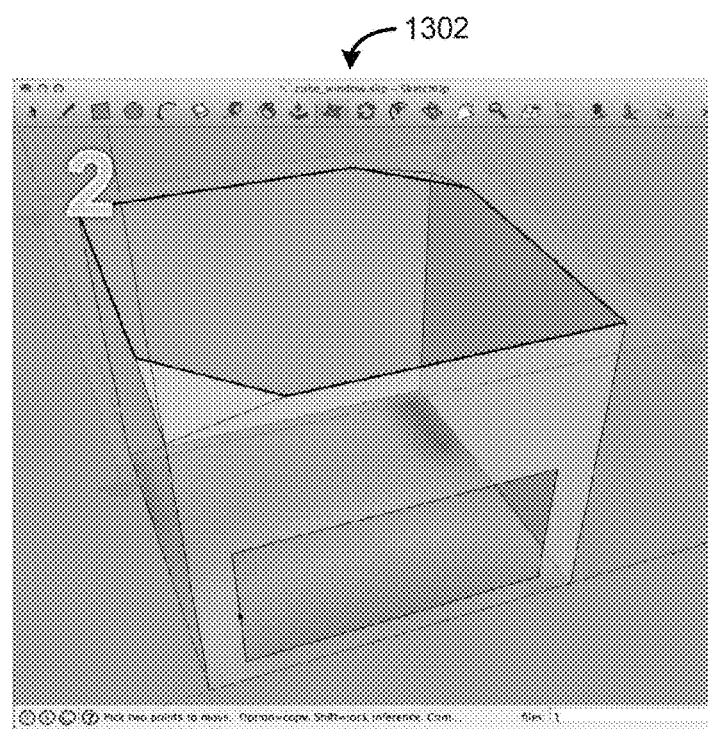

FIGS. 13A and 13B provide screenshots 1300 and 1302 illustrating visual design feedback during design of a computer-implemented design model representing an example architectural structure in accordance with some embodiments of the technology disclosed herein. In particular, the screenshots 1300 and 1302 may be of an example GUI of an example CAD software accessing the computer-implemented design model. Screenshots 1300 and 1302 illustrate how a daylighting factor heat map is being presented as design feedback with respect to the computer-implemented design model, and how the daylighting factor heat map is affected when a user, for example, selects an edge of a design model element representing a window and expands it horizontally. In accordance with various embodiments, after the window is increased in size, a new architecture structure analysis is triggered for the current computer-implemented design model having the modified design model element (e.g., window), and the daylighting factor heat map is updated accordingly.

As previously described, and referring back to FIG. 2, the architectural structure analysis client 202 may receive analysis data from the architectural structure analysis server 20 relating to the impact of one or more modifications to the architectural structure. Modifications may include the addition, deletion, and/or modification of one or more design elements that make up a computer-implemented design model. Additionally, the architectural structure analysis client 202 may present the impact analysis data as design feedback. Facilitating design feedback through the architectural structure modeling module 208 may entail utilizing a design feedback plugin module 218 that may be configured to capture actions performed on the computer-implemented design model by the user using architectural structure modeling module 208.

In some embodiments, the design feedback plugin module 218 may communicate a current state of the computer-implemented design model when the design feedback plugin module 218 detects modification of the computer-implemented design model through the architectural structure modeling module 208. In some embodiments, the design feedback plugin module 218 may retrieve stored states of the computer-implemented design model, and thereby communicate or otherwise present historical impact analysis data that can reflect past modifications of the computer-implemented design model. In still other embodiments, both current and historical impact analysis data may be presented to the user, thus enabling the presentation of impact analysis data trends throughout a particular design process.

The presentation of such impact analysis data may be accomplished through a GUI panel, similar to that illustrated in FIGS. 6A, 6B, 7, and 8A-8D and described above. However, and in addition to or instead of presenting total/aggregated "Energy Use" data and "Daylighting Potential" data as graphs, various embodiments may present a visual representation of heating and cooling load (along with applicable contributors that impact the heating and cooling load) associated with a current and/or historical state of a computer-implemented design model, in real or near-real time.

In order to present the impact analysis data in a visually efficient and meaningful manner, the impact analysis data may further be identified as instances of, or categorized into types of, design elements that may have an impact on the heating and/or cooling load, which can be thought of as building component contributors. For example, building component contributors may include, but are not limited to the following: infiltration; required fresh air; roof conduction; wall conduction; floor conduction; appliances; north solar; glazing conduction; and lighting.

Accordingly, and again with continued reference to FIG. 2, the energy use analysis engine 222 may be utilized to determine the predicted energy use of the architectural structure based on some or all of the building data 230. Prior to or in addition to aggregating and coalescing the results to produce impact analysis data 234 for display in a singular graph format (as illustrated in FIG. 7), the building data 230 may be analyzed (e.g., by the energy use analysis engine 222) in terms of the individual or respective contributions of the building component contributors. Therefore, the impact analysis data 234 may also include individual building component contributor data.

It should be noted that in accordance with various embodiments described herein, building data 230 can be derived from delta data gleaned from changes to a computer-implemented design model. However, in accordance with still other embodiments, the building data 230 may be obtained and/or analyzed as a whole. For example, the impact analysis data disclosed herein may also be determined based on entire, new and different instances of a computer-implemented design model, for example, rather than using delta data.

It can be appreciated that the unintentional introduction of outside air into a building through door frames, for example, affects infiltration, which in turn can impact the heating and/or cooling load of that building. As another example, depending on the design elements utilized in designing a roof, roof conduction can vary, which in turn can also impact the heating and/or cooling load. Yet another example may be the amount of lighting designed into the computer-implemented design model, where a particular amount and type of lighting elements, aside from providing light, may also impact required/desired heating and cooling load of a building. This is because the output of light often results in the output of heat as well, thereby reducing the predicted load on. e.g., a heating aspect of the HVAC system, while perhaps increasing the load on. e.g., an air conditioning aspect of the HVAC system.

Accordingly, each of the building component contributors may be presented in a manner that visually indicates or otherwise represents their respective impact (positive or negative) on the heating and cooling of a computer-implemented design model of an architectural structure. This may include visually representing whether a particular building component contributor has a positive or negative effect on the heating and/or cooling load. This may also include visually representing the magnitude of impact (whether positive or negative) a building component contributor has on the heating and/or cooling load. For example, and referring again to the lighting building component contributor, including electric lighting in the computer-implemented design model of the architectural structure can be construed to have a positive effect on heating, because as described above, the use of lighting fixtures can contribute to the heating of a building. Conversely, the use of lighting fixtures can be construed to have a negative effect on cooling load, as the HVAC system may have to use increased energy use for cooling to compensate for the increased heat generated by the lighting elements.

It should be noted that some building component contributors may have an inverse relationship with regard to impact on heating and cooling load, such as lighting, while others may not. For example, with infiltration, the unintentional introduction of air can negatively affect both heating and cooling load. Moreover, each building component contributor itself, may comprise a plurality of different aspects that together can impact heating and/or cooling load. For example, lighting as a building component contributor may include lighting fixtures as well as daylighting.

It should be further noted that certain building component contributors may have a combination of impacts on either the heating load or the cooling load. For example, infiltration, wall conduction, roof conduction, and/or glazing conduction may have both a positive effect and a negative effect on cooling load, depending on, e.g., seasonal climates, day-night weather conditions, etc. For example, in a climate such as San Diego, an early morning breeze can positively impact cooling load, as cool air moving through a building (via, e.g., open windows or doors) can have a cooling effect. However, in the same building, windows or doors that are open during the midday hours when temperatures are hotter can allow cool air generated via the air conditioning aspect of the building's HVAC system to leak out, impacting the cooling load negatively. Such impact analysis data can be invaluable to architects/designers that, for example, may be unfamiliar with the particular weather/climate conditions of a geographical location at which an architectural structure they are designing is to be located. For example, the energy performance of a computer-implemented design model can still be optimized even when an architect or designer is not necessarily aware of/knowledgeable about the particulars of a geographical location. Additionally, the GUI can present the positive or negative impacts of the components in a quantifiable manner to the architects/designers, and this can be shown in real time as building component contributors are changed.

Further still, the actual heating and cooling load may be visually represented in the GUI panel to indicate a quantifiable metric such as "heating hours" and "cooling hours."

That is, the visual representations of heating and cooling load can reflect the respective power or energy consumption required to heat and cool the architectural structure represented by the computer-implemented design model. For example, if the architectural structure is placed in a geographical location that experiences colder temperatures, there will be a greater heating load, which can be represented in, e.g., Kilowatt hours per year, than if placed in a geographical location that experiences warmer temperatures. Moreover, the system can show the change to the heating and cooling load as a result of changes to building component contributors.

To relate the building component contributors to the heating and cooling load of the computer-implemented design model of the architectural structure, visual connectors can be used. These visual connectors may associate each applicable building component contributor representation to the heating load and cooling load representations. As described above, the visual connectors can reflect the magnitude of the effect of the building component contributor, as well as whether the effect is positive or negative. Displaying the magnitude and the type of impact a particular building component contributor may have on heating and/or cooling load allows an architect or designer to easily ascertain, e.g., which building component contributors play a role in affecting energy use, and to what extent.

Figure 14:
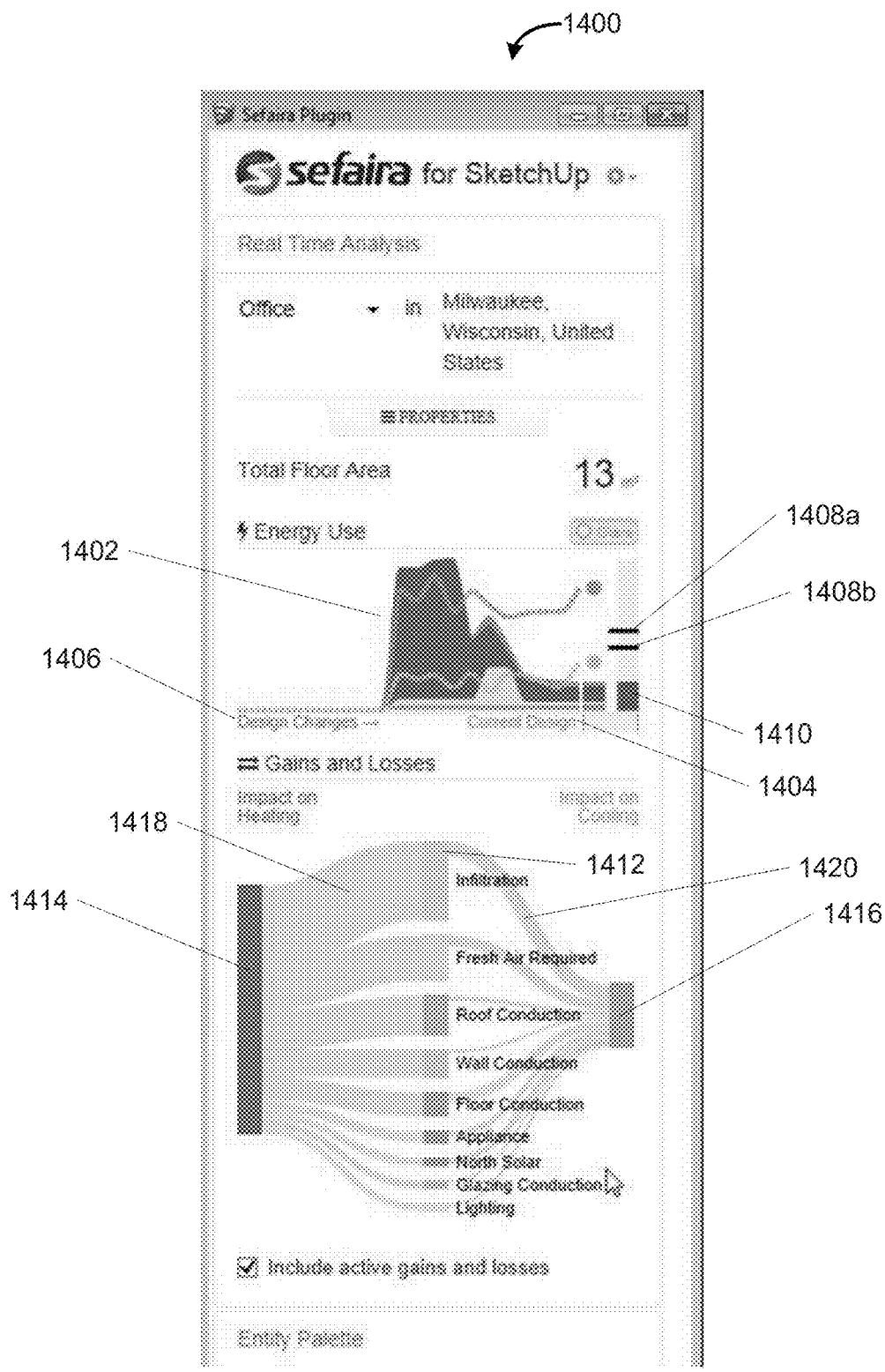
FIG. 14 provides a screenshot illustrating an example GUI panel for architectural structure analysis in accordance with some embodiments of the technology disclosed herein.

FIG. 14 is a screenshot of an example GUI panel 1400 for architectural structure analysis that includes impact analysis data in accordance with various embodiments. Similar to the GUI panel illustrated in FIG. 7, energy use (based on aggregated and coalesced energy analysis results) may be displayed as a graph 1402. This graph of energy use may reflect the energy use associated with a current design 1404 as well as the energy use associated with previous design changes 1406, thereby reflecting a history of design changes, from which one or more energy use trends may be gleaned, or simply, from which a current design can be compared to previous iterations. For example, a user may notice from the graph 1402 that certain design changes may have an increasingly negative effect on energy use, in particular, heating. Realizing this trend, the user may be motivated to explore alternative design changes that have less of a negative impact. As another example, a user might determine that recent changes have yielded poor performance, and the user may desire to go back to a prior iteration and explore alternative modifications from that point. It should be noted that information or data regarding daylighting potential, as illustrated in, e.g., FIG. 7, may also be displayed, as a graph, for example, in GUI panel 1400. Similar to the energy use graph 1402, a trend which suggests how daylight levels are evolving may also be gleaned. In various embodiments, design parameters can be stored for prior iterations and the system can be configured to allow the user to go back to a prior design through the use of energy use graph 1402.

Additionally, one or more benchmark indicators 1408a and 1408b may be presented proximate to the graph 1402 in order to present a user with a visual representation of a standard, certification, or other rating, the attainment of which would be beneficial for the computer-implemented design of the architectural structure being modeled. In order to gauge the attainment of one or more benchmarks, a gauge 1410 can also be presented relative to the one or more benchmark indicators 1408a and 1408b. Color and/or height or other type of gauge may be utilized to reflect whether or not a benchmark(s) has been attained. In this example, gauge 1410 remains below two energy use thresholds associated with benchmark indicators 1408a and 1408b, suggesting that the current design of the computer-implemented design model is meeting these benchmarks.

Also presented on the GUI panel of FIG. 14 are visual representations of the building component contributors, one of which (representative of infiltration) is denoted as infiltration building component contributor 1412. In order to associate the building component contributors to the heating load 1414 and the cooling load 1416, visual connectors can be displayed from each of the building component contributors to the heating load 1414 and cooling load 1416. For example, visual connector 1418 visually represents the impact of infiltration building component contributor 1412 to heating load 1414, and visual connector 1420 visually represents the impact of infiltration building component contributor 1412 to cooling load 1416.

As discussed previously, the magnitude of impact on heating or cooling load can be represented by the connectors in terms of, for example, the size (e.g., width), color or intensity of the connector, although other representations may be utilized in accordance with other embodiments. For example, it can be appreciated that the impact of infiltration building component contributor 1412 on heating load 1414 is greater than its impact on cooling load 1416 as evidenced by the wider height of connector 1418 as opposed to the narrower width of connector 1420.

Figure 15A:
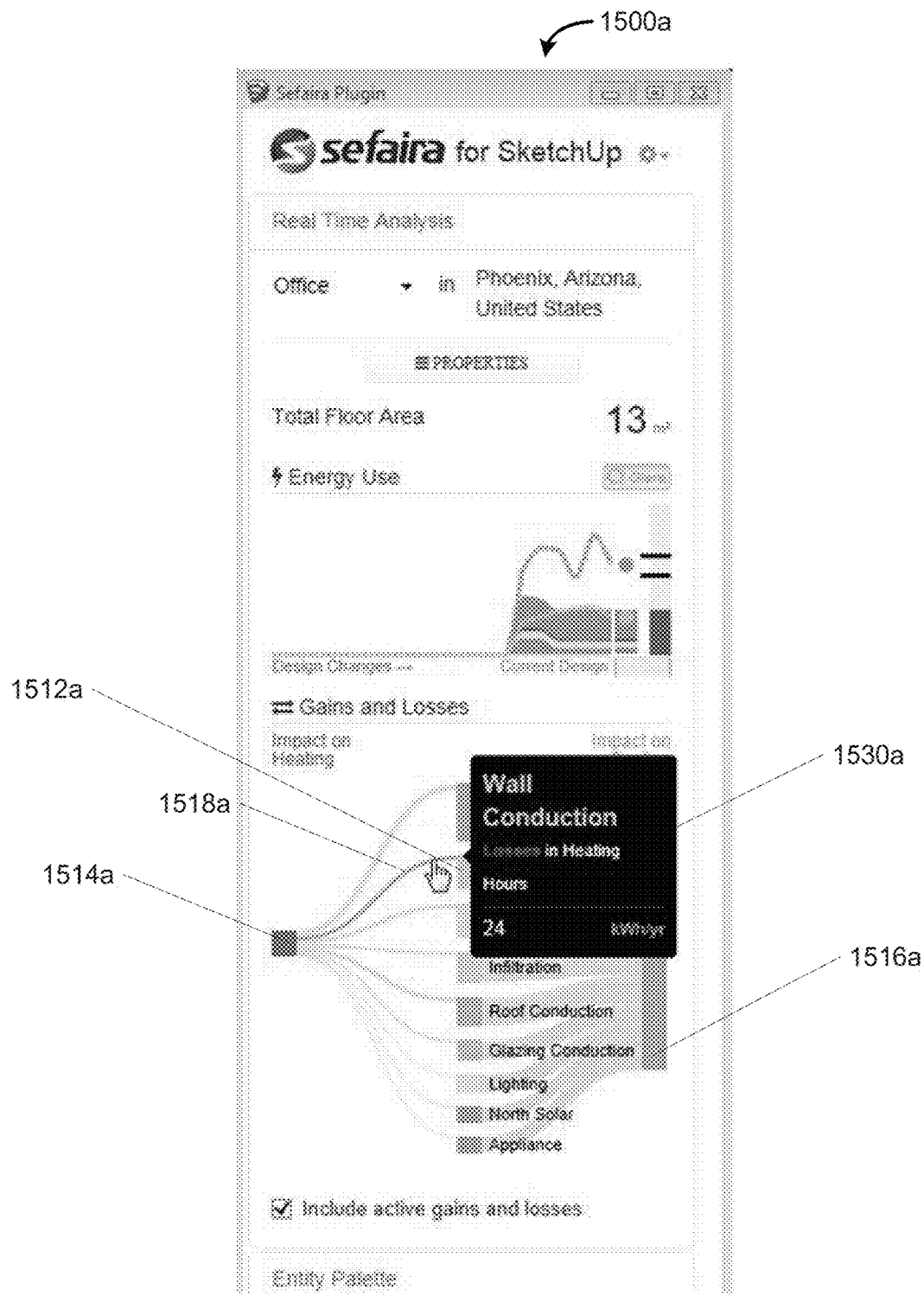
FIGS. 15A-15C provide screenshots illustrating example GUI panels for architectural structure analysis in accordance with some embodiments of the technology disclosed herein.

FIG. 15A is a screenshot of an example GUI panel 1500a for architectural structure analysis that includes impact analysis data in accordance with various embodiments. GUI panel 1500a may include a visual representation of heating load 1514a and cooling load 1516a. Displayed in between the representations of heating load 1514a and cooling load 1516a are building component contributors, such as wall conduction building component contributor 1512a. As illustrated in FIG. 15A GUI panel 1500a may further include a mechanism for interactively displaying textual and/or numerical details regarding a particular connector. For example, upon a user clicking, selecting, or otherwise actuating connector 1518a, detailed information represented by connector 1518a may be displayed in a pop-up window 1530a. In this instance, GUI panel 1500a displays losses in heating in terms of kWh per year. It should be noted that more or less detail may be displayed in one or more pop-up windows in accordance with other embodiments. In various embodiments, controls may also be provided in the pop-up to allow the user to adjust the parameter values for the subject building component contributor.

Figure 15B:
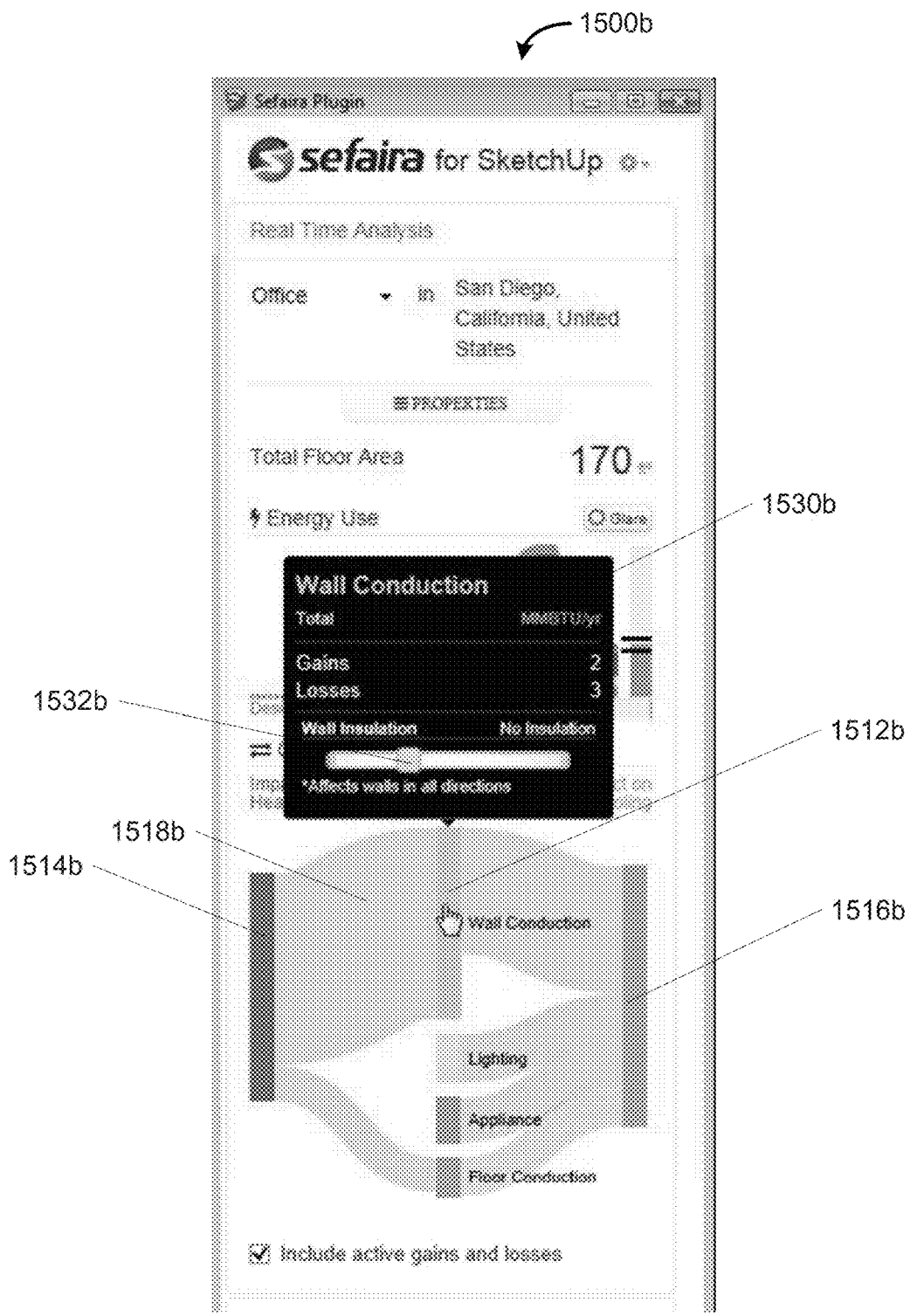

FIG. 15B is a screenshot of an example GUI panel 1500b for architectural structure analysis that includes impact analysis data in accordance with various embodiments. Displayed in between the representations of heating load 1514b and cooling load 1516b are building component contributors, such as wall conduction building component contributor 1512b. As illustrated in FIG. 15B, GUI panel 1500b may further include a mechanism for interactively displaying textual and/or numerical details regarding a particular building component contributor. For example, upon a user clicking, selecting, or otherwise actuating wall conductor building component contributor 1512b, detailed information represented by wall conductor building component contributor 1512b may be displayed in a pop-up window 1530b. In this instance, pop-up window 1530b is interactive, allowing the user to adjust parameter values for the wall insulation, e.g., whether or not to include wall insulation, thickness of wall insulation, R-value of the wall insulation, etc. using an input such as the example sliding bar/mechanism 1532b illustrated. Additional detail, such as total gains and losses in million British Thermal Units (mmBTU) per year can be included. It should be noted that more or less detail may be displayed in one or more pop-up windows in accordance with other embodiments.

It should be noted that the ability to interactively display and allow for the adjustment of building component contributors provides users with a convenient and efficient mechanism for tweaking, or otherwise altering specific aspects of a computer-implemented design model without necessarily interacting directly with the model itself. For example, and referring back to, e.g., FIG. 6A, a user's actions or design choices/changes to computer-implemented design model 606a drives the presentation of impact analysis data in GUI panel 604a. In other words, design feedback information is obtained based on a user's design choices. However, in some embodiments, such as that described in FIG. 15B, the user may, in an opposite manner, utilize GUI panel 1500b to drive the design/effectuate changes to the computer-implemented design model. That is, a user may utilize an interactive pop-up window, such as window 1530b, to make design changes that are subsequently reflected in the computer-implemented design model.

Figure 15C:
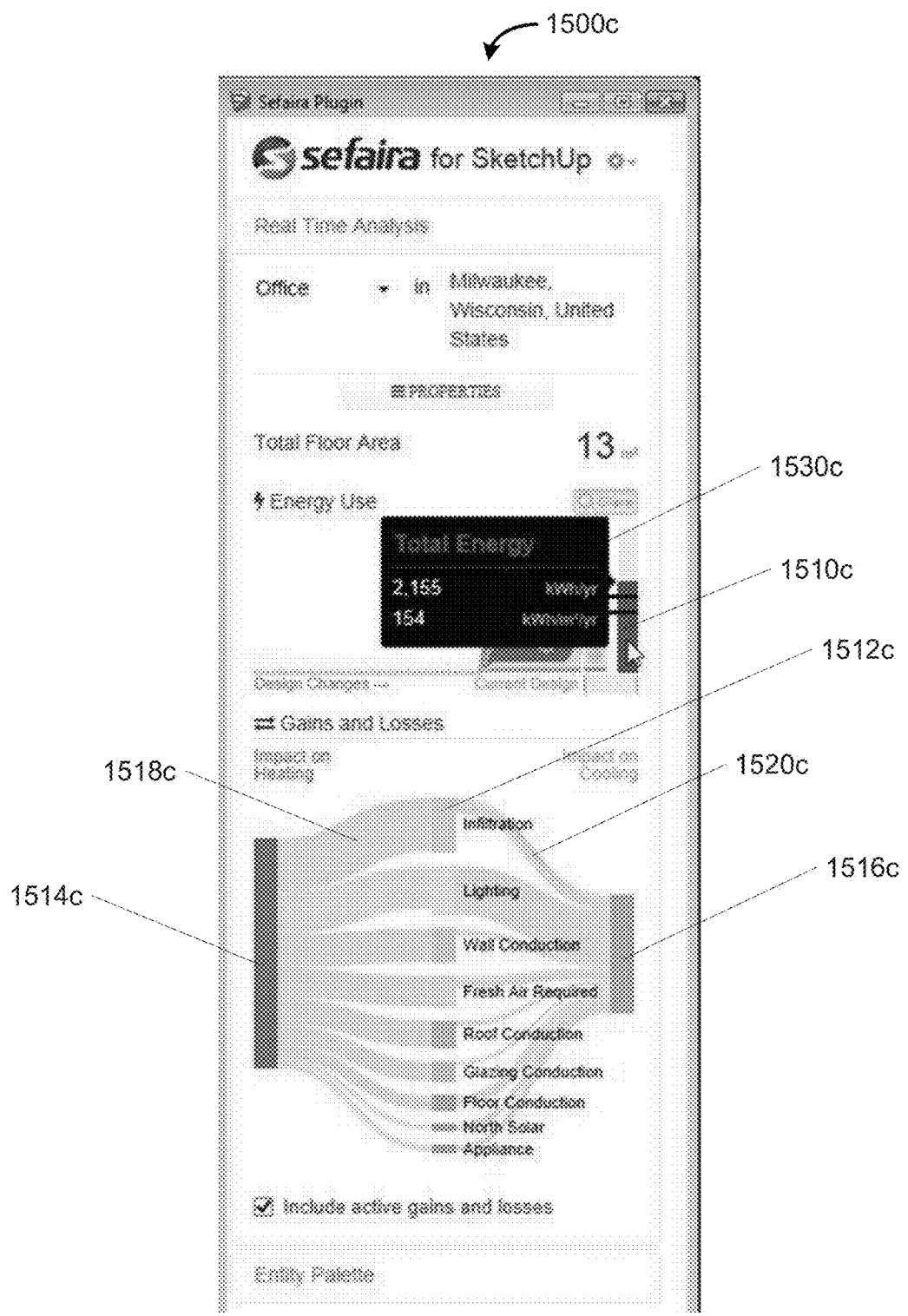

FIG. 15C is a screenshot of an example GUI panel 1500c for architectural structure analysis that includes impact analysis data in accordance with various embodiments. Displayed in between the representations of heating load 1514c and cooling load 1516c are building component contributors, such as infiltration building component contributor 1512c. As illustrated in FIG. 15c, GUI panel 1500c may further include a mechanism for interactively displaying textual and/or numerical details regarding gauge 1510c. For example, upon a user clicking, selecting, or otherwise actuating gauge 1510c, detailed information represented by gauge 1510c may be displayed in a pop-up window 1530c. In this instance, pop-up window 1530c displays total energy details in terms of kWh per year and total energy use per square meter per year (kWh/m$^2$/yr). It should be noted that more or less detail may be displayed in one or more pop-up windows in accordance with other embodiments.

Further still, it should be noted that other aspects of a GUI panel configured in accordance with various embodiments may be selected, clicked, or otherwise actuated to prompt the display of a pop-up window. For example, a certain stage in design can be displayed in a GUI panel by selecting a particular area of the total Energy Use graph. This can allow a user to review, e.g., previous design stages to view relevant impact analysis data to glean desired information that may be useful in optimizing the current computer-implemented design model.

Additionally, a user may click on one of the heating or cooling load representations to initiate display of a pop-up window containing information indicative of "total" HVAC heating or cooling data, such as total gains or losses in kWh per year. Moreover, the pop-up window may be interactive, as previously described, which in this example, may be an interactive slider allowing the user to adjust "total" heating or cooling efficiency. Adjusting total heating or cooling efficiency can provide the user with another perspective, allowing the user to see how a desired total heating load may affect the individual building component contributors, as opposed to observing how changes to an individual building component contributor affects total heating or cooling load (illustrated in FIG. 15B).

Figure 16:
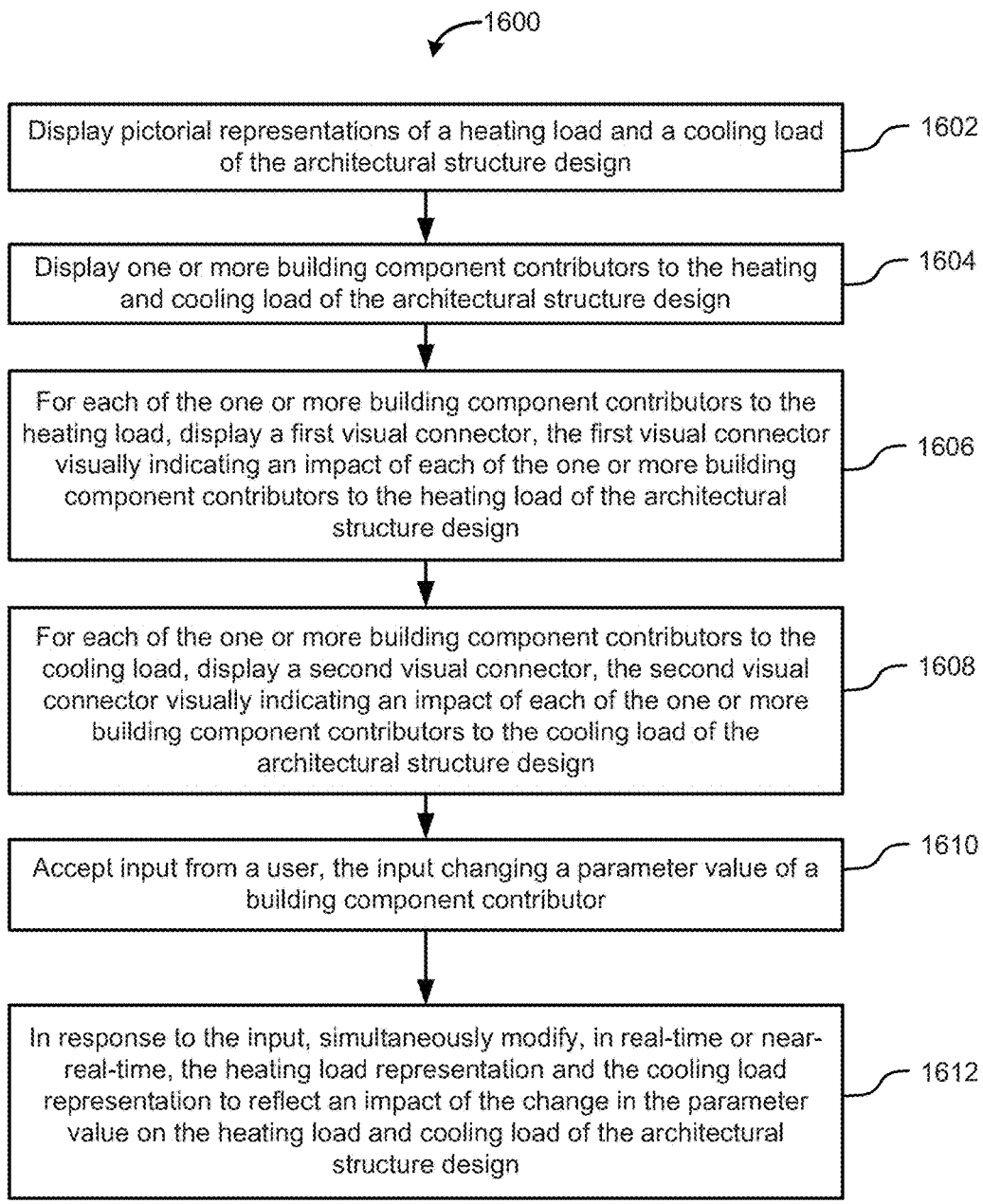
FIG. 16 is a flow chart illustrating an example method for analyzing an architectural structure in accordance with some embodiments of the technology disclosed herein.

FIG. 16 is a flow chart illustrating an example method 1600 that may be performed for analyzing an architectural structure in accordance with various embodiments. According to some embodiments, the method 1600 may be one performed by the architectural structure analysis server 206 during the design of a computer-implemented design model through the architectural structure analysis client 202.

As shown in FIG. 16, the method 1600 may begin at operation 1602 where pictorial representations of a heating load and a cooling load of an architectural structure design is displayed. For example, and as previously described and illustrated, the heating load representation and cooling load representation may be presented as bars in a GUI panel. At operation 1604, one or more building component contributors to the heating and cooling loads of the architectural structure design are displayed. For example, infiltration, wall conduction, lighting, glazing, etc. may be considered to be building component contributors that impact the heating and cooling load of an architectural structure. Visual representations of these building component contributors may be presented on the GUI panel as bars in between the pictorial representations of the heating and cooling loads.

At operation 1606, and for each of the one or more building component contributors to the heating load, a first visual connector is displayed, the first visual connector visually indicating an impact of each of the one or more building component contributors to the heating load of the architectural structure design. At operation 1608, and for each of the one or more building component contributors to the cooling load, a second visual connector is displayed, the second visual connector visually indicating an impact of each of the one or more building component contributors to the cooling load of the architectural structure design. For example, the visual connectors connecting each of the one or more building component contributors can indicate a magnitude and type of impact on the heating and cooling loads by virtue of either, e.g., width and/or color of the visual connectors.

At operation 1610, input is accepted from a user, the input changing a parameter value of a building component contributor. That is, a user may effectuate a design change to the architectural structure design that is related to one or more building component contributors, and ultimately affects a parameter value associated with the related building component contributor(s). Alternatively, the user may effectuate a change "directly" from the GUI panel and from the perspective of a building component contributor itself.

Figure 17:
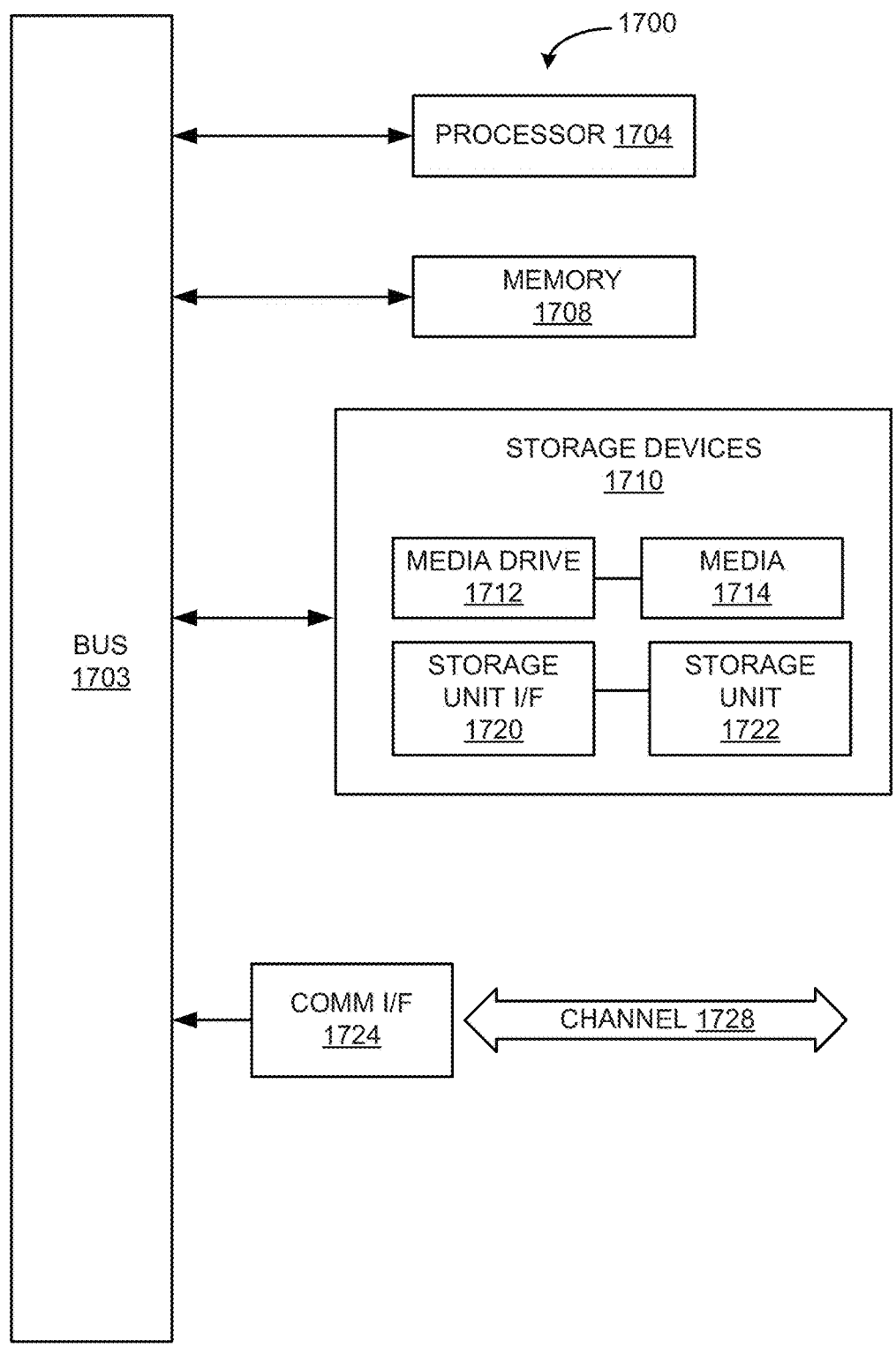
FIG. 17 illustrates an example computing module that may be used in implementing various features of embodiments of the disclosed technology.

At operation 1612, in response to the input, the heating load representation and the cooling load representation are simultaneously modified, in real-time or near-real-time, to reflect an impact of the change in the parameter value on the heating load and cooling load of the architectural structure design. For example, any changes to the design of a computer-implemented design model that may have an impact on heating and cooling loads, can have that impact reflected visually on the GUI panel.

Where components or modules of the technology are implemented in whole or in part using software, in one embodiment, these software elements can be implemented to operate with a computing or processing module capable of carrying out the functionality described with respect thereto. One such example computing module is shown in FIG. 17. Various embodiments are described in terms of this example-computing module 1700. After reading this description, it will become apparent to a person skilled in the relevant art how to implement the technology using other computing modules or architectures.

Referring now to FIG. 17, computing module 1700 may represent, for example, computing or processing capabilities found within desktop, laptop and notebook computers; hand-held computing devices (PDA's, smart phones, cell phones, palmtops, etc.); mainframes, supercomputers, workstations or servers; or any other type of special-purpose or general-purpose computing devices as may be desirable or appropriate for a given application or environment. Computing module 1700 might also represent computing capabilities embedded within or otherwise available to a given device. For example, a computing module might be found in other electronic devices such as, for example, digital cameras, navigation systems, cellular telephones, portable computing devices, modems, routers, WAPs, terminals and other electronic devices that might include some form of processing capability.

Computing module 1700 might include, for example, one or more processors, controllers, control modules, or other processing devices, such as a processor 1704. Processor 1704 might be implemented using a general-purpose or special-purpose processing engine such as, for example, a microprocessor, controller, or other control logic. In the illustrated example, processor 1704 is connected to a bus 1702, although any communication medium can be used to facilitate interaction with other components of computing module 1700 or to communicate externally.

Computing module 1700 might also include one or more memory modules, simply referred to herein as main memory 1708. For example, preferably random access memory (RAM) or other dynamic memory, might be used for storing information and instructions to be executed by processor 1704. Main memory 1708 might also be used for storing temporary variables or other intermediate information during execution of instructions to be executed by processor 1704. Computing module 1700 might likewise include a read only memory ("ROM") or other static storage device coupled to bus 1702 for storing static information and instructions for processor 1704.

The computing module 1700 might also include one or more various forms of information storage mechanism 1710, which might include, for example, a media drive 1712 and a storage unit interface 1720. The media drive 1712 might include a drive or other mechanism to support fixed or removable storage media 1714. For example, a hard disk drive, a floppy disk drive, a magnetic tape drive, an optical disk drive, a CD or DVD drive (R or RW), or other removable or fixed media drive might be provided. Accordingly, storage media 1714 might include, for example, a hard disk, a floppy disk, magnetic tape, cartridge, optical disk, a CD or DVD, or other fixed or removable medium that is read by, written to or accessed by media drive 1712. As these examples illustrate, the storage media 1714 can include a computer usable storage medium having stored therein computer software or data.

In alternative embodiments, information storage mechanism 1710 might include other similar instrumentalities for allowing computer programs or other instructions or data to be loaded into computing module 1700. Such instrumentalities might include, for example, a fixed or removable storage unit 1722 and an interface 1720. Examples of such storage units 1722 and interfaces 1720 can include a program cartridge and cartridge interface, a removable memory (for example, a flash memory or other removable memory module) and memory slot, a PCMCIA slot and card, and other fixed or removable storage units 1722 and interfaces 1720 that allow software and data to be transferred from the storage unit 1722 to computing module 1700.

Computing module 1700 might also include a communications interface 1724. Communications interface 1724 might be used to allow software and data to be transferred between computing module 1700 and external devices. Examples of communications interface 1724 might include a modem or softmodem, a network interface (such as an Ethernet, network interface card, WiMedia, IEEE 802.XX or other interface), a communications port (such as for example, a USB port, IR port, RS232 port Bluetooth® interface, or other port), or other communications interface. Software and data transferred via communications interface 1724 might typically be carried on signals, which can be electronic, electromagnetic (which includes optical) or other signals capable of being exchanged by a given communications interface 1724. These signals might be provided to communications interface 1724 via a channel 1728. This channel 1728 might carry signals and might be implemented using a wired or wireless communication medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to media such as, for example, memory 1708, storage unit 1720, media 1714, and channel 1728. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 1700 to perform features or functions of the disclosed technology as discussed herein.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

The invention claimed is:

1. A method for displaying real-time impact analysis feedback of an architectural structure design, comprising:
simultaneously displaying on a display screen:
   a pictorial representation of a heating load of the architectural structure design;
   a pictorial representation of a cooling load of the architectural structure design, wherein the heating load and the cooling load represent power or energy consumption required to heat and cool a structure represented by the architectural structure design for a period of time;
   one or more building component contributors to the heating load and to the cooling load of the architectural structure design, the one or more building component contributors representing at least one of infiltration, required fresh air, roof conduction, wall conduction, floor conduction, appliances, north solar, glazing conduction, or lighting of the architectural structure design;
   a pictorial representation of a first visual connector visually indicating an impact of each of the one or more building component contributors to the heating load of the architectural structure design; and
   a pictorial representation of a second visual connector visually indicating an impact of each of the one or more building component contributors to the cooling load of the architectural structure design, wherein for at least one of the one or more building component contributors, the pictorial representation of the first visual connector is displayed adjacent to the pictorial representation of the second visual connector to provide a visual comparison between the impact to the heating load and the impact to the cooling load;
accepting input from a user, the input changing a parameter value of a building component contributor; and
in response to the input, simultaneously modifying, in real-time or near-real-time, the heating load representation and the cooling load representation on the display screen to reflect an impact of the change in the parameter value on the heating load and on the cooling load of the architectural structure design.

2. The method of claim 1 further comprising, in response to the input, modifying, in real-time or near-real-time, at least one of the pictorial representation of the first visual connector and the pictorial representation of the second visual connector to reflect the impact of the change in the parameter value on the heating load and on the cooling load of the architectural structure design.

3. The method of claim 2, wherein modifying of at least one of the pictorial representation of the first visual connector and the pictorial representation of the second visual connector comprises adjusting at least one of a color and width associated with the at least one of the pictorial representation of the first visual connector and the pictorial representation of the second visual connector.

4. The method of claim 1, wherein the pictorial representation of the first visual connector and the pictorial representation of the second visual connector visually indicate at least one of a positive impact and a negative impact to each of the heating load and the cooling load of the architectural structure design.

5. The method of claim 1 further comprising, concurrently with the displaying of the one or more building component contributors, the pictorial representation of the first visual connector, and the pictorial representation of the second visual connector, displaying a graphical representation of a summary of design change states of the architectural structure design.

6. The method of claim 5 further comprising, displaying one or more design benchmarks relative to the summary of design change states.

7. The method of claim 5, wherein the summary of design change states reflects impact analysis trends.

8. The method of claim 5 further comprising, upon selection of an area of the graphical representation of the summary of design change states of the architectural structure design, displaying a status of the pictorial representations of the heating load and the cooling load, the one or more building component contributors, the pictorial representation of the first visual connector, and the pictorial representation of the second visual connector corresponding to one of a current design change state and a historical design change state.

9. The method of claim 5 further comprising, concurrently with the displaying of the one or more building component contributors, the pictorial representation of the first visual connector, the pictorial representation of the second visual connector, and the graphical representation of the summary of design change states of the architectural structure design, displaying a graphical representation of an evolution of daylight levels associated with the design change states of the architectural structure design.

10. The method of claim 1, wherein the accepted input comprises a design change to the architectural structure design generated on a computer-implemented design model.

11. The method of claim 1, wherein the accepted input comprises a design change to the architectural structure design generated by altering the at least one of the one or more building component contributors.

12. The method of claim 11, wherein the at least one of the one or more building component contributors comprises an interactive display element configured to at least one of display textual information associated with the at least one of the one or more building component contributors and display an adjustable element through which the parameter value of the at least one of the one or more building component contributors is altered.

13. The method of claim 1, wherein the pictorial representation of the heating load comprises an interactive display element configured to at least one of display textual information associated with the heating load and display an adjustable element associated with the heating load.

14. The method of claim 1, wherein the pictorial representation of the cooling load comprises an interactive display element configured to at least one of display textual information associated with the cooling load and display an adjustable element associated with the cooling load.

15. The method of claim 1, wherein the pictorial representation of the first visual connector and the pictorial representation of the second visual connector comprise interactive display elements configured to display textual information respectively associated with the pictorial representation of the first visual connector and the pictorial representation of the second visual connector.

16. A computer program product embedded on non-transitory computer storage media, which when executed by a computer, causes the computer to implement a method for displaying real-time impact analysis feedback of an architectural structure design, comprising:
  code for simultaneously displaying on a display screen:
    a pictorial representation of a heating load of the architectural structure design;
    a pictorial representation of a cooling load of the architectural structure design, wherein the heating load and the cooling load represent power or energy consumption required to heat and cool a structure represented by the architectural structure design for a period of time;
    one or more building component contributors to the heating load and to the cooling load of the architectural structure design, the one or more building component contributors representing at least one of infiltration, required fresh air, roof conduction, wall conduction, floor conduction, appliances, north solar, glazing conduction, or lighting of the architectural structure design;
    a pictorial representation of a first visual connector for each of the one or more building component contributors to the heating load, the pictorial representation of the first visual connector visually indicating an impact of each of the one or more building component contributors to the heating load of the architectural structure design; and
    a pictorial representation of a second visual connector for each of the one or more building component contributors to the cooling load, the pictorial representation of the second visual connector visually indicating an impact of each of the one or more building component contributors to the cooling load of the architectural structure design;
  code for accepting input from a user, the input changing a parameter value of a building component contributor; and
  code for modifying, in real-time or near-real-time, the heating load representation and the cooling load representation on the display screen in response to the input to reflect an impact of the change in the parameter value on the heating load and on the cooling load of the architectural structure design.

17. The computer program product of claim 16 further comprising, computer code for, in response to the input, modifying, in real-time or near-real-time, at least one of the pictorial representation of the first visual connector and the pictorial representation of the second visual connector to reflect the impact of the change in the parameter value on the heating load and on the cooling load of the architectural structure design.

18. The computer program product of claim 16 further comprising, computer code for, concurrently with the displaying of the one or more building component contributors, the pictorial representation of the first visual connector, and the pictorial representation of the second visual connector, displaying a graphical representation of a summary of design change states of the architectural structure design.

19. A computer system comprising:
  at least one processor; and
  a memory storing instructions configured to instruct the at least one processor to perform:
    simultaneously displaying on a display screen:
      pictorial representations of a heating load and a cooling load of the architectural structure design;
      one or more building component contributors to the heating load and to the cooling load of the architectural structure design, the one or more building component contributors representing at least one of infiltration, required fresh air, roof conduction, wall conduction, floor conduction, appliances, north solar, glazing conduction, or lighting of the architectural structure design;
      a pictorial representation of a first visual connector, the pictorial representation of the first visual connector visually indicating an impact of each of the one or more building component contributors to the heating load of the architectural structure design; and
      a pictorial representation of a second visual connector, the pictorial representation of the second visual connector visually indicating an impact of each of the one or more building component contributors to the cooling load of the architectural structure design, wherein for at least one of the one or more building component contributors, the pictorial representation of the first visual connector is displayed adjacent to the pictorial representation of the second visual connector to provide a visual comparison between the impact to the heading load and the impact to the cooling load;
    accepting input from a user, the input changing a parameter value of a building component contributor; and
    in response to the input, modifying, in real-time or near-real-time, the heating load representation and the cooling load representation on the display screen to reflect an impact of the change in the parameter value on the heating load and on the cooling load of the architectural structure design.

20. The computer system of claim 19, wherein the memory further instructs the at least one processor to perform, in response to the input, modifying, in real-time or near-real-time, at least one of the pictorial representation of the first visual connector and the pictorial representation of the second visual connector to reflect the impact of the change in the parameter value on the heating load and on the cooling load of the architectural structure design.

* * * * *